(12) United States Patent
Sassa et al.

(10) Patent No.: US 10,333,067 B2
(45) Date of Patent: *Jun. 25, 2019

(54) METHOD FOR MANUFACTURING ORGANIC ELECTRONIC ELEMENT, AND METHOD FOR FORMING ELECTRON HOLE INJECTION LAYER

(71) Applicant: SUMITOMO CHEMICAL COMPANY, LIMITED, Tokyo (JP)

(72) Inventors: Shuichi Sassa, Osaka (JP); Shinichi Morishima, Niihama (JP); Kouichi Rokuhara, Tsukuba (JP)

(73) Assignee: SUMITOMO CHEMICAL COMPANY, LIMITED, Chuo-ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/738,201

(22) PCT Filed: Jun. 21, 2016

(86) PCT No.: PCT/JP2016/068431
§ 371 (c)(1),
(2) Date: Dec. 20, 2017

(87) PCT Pub. No.: WO2016/208596
PCT Pub. Date: Dec. 29, 2016

(65) Prior Publication Data
US 2018/0182964 A1    Jun. 28, 2018

(30) Foreign Application Priority Data

Jun. 22, 2015 (JP) .................... 2015-125059

(51) Int. Cl.
*H01L 51/00* (2006.01)
*H01L 29/786* (2006.01)
(Continued)

(52) U.S. Cl.
CPC ........ *H01L 51/0026* (2013.01); *H01L 29/786* (2013.01); *H01L 51/0097* (2013.01);
(Continued)

(58) Field of Classification Search
CPC ............ H01L 51/0026; H01L 51/0039; H01L 51/0043; H01L 51/0097; H01L 51/0003; H01L 29/786
See application file for complete search history.

(56) References Cited

U.S. PATENT DOCUMENTS 7,166,242 B2* 1/2007 Seki .................... H01L 51/0007
  252/500
8,138,364 B2* 3/2012 Marks .................... C03C 17/36
  556/130
(Continued)

FOREIGN PATENT DOCUMENTS

CN    104365180 A    2/2015
JP    2004-127897 A   4/2004
(Continued)

OTHER PUBLICATIONS

International Preliminary Report on Patentability dated Jan. 4, 2018, with Written Opinion in counterpart International Application No. PCT/JP2016/068431.
(Continued)

*Primary Examiner* — William Coleman
(74) *Attorney, Agent, or Firm* — Sughrue Mion, PLLC

(57) ABSTRACT

A method for manufacturing an organic electronic element according to one embodiment includes: a hole injection layer coating film formation step of applying a hole injection layer coating liquid containing a material having an electron-accepting property on a plastic substrate 10 to form a hole injection layer coating film 22b; and a heat treatment step of heating the hole injection layer coating film by irradiating the hole injection layer coating film with an infrared ray to form a hole injection layer. The hole injection layer coating film has absorption in a first wavelength range of 1.2 µm to 5.0 µm, and the infrared ray is an infrared ray in which 80% or more of total radiation energy of the
(Continued)

infrared ray in a wavelength range of 1.2 μm to 10.0 μm is included in the first wavelength range.

15 Claims, 14 Drawing Sheets

(51) Int. Cl.
    *H05B 33/02* (2006.01)
    *H05B 33/10* (2006.01)
    *H01L 51/50* (2006.01)
    *H01L 51/05* (2006.01)
    *H01L 51/42* (2006.01)
    *H01L 51/56* (2006.01)

(52) U.S. Cl.
    CPC ......... *H01L 51/5088* (2013.01); *H05B 33/02* (2013.01); *H05B 33/10* (2013.01); *H01L 51/0003* (2013.01); *H01L 51/0039* (2013.01); *H01L 51/0043* (2013.01); *H01L 51/0512* (2013.01); *H01L 51/0545* (2013.01); *H01L 51/0558* (2013.01); *H01L 51/42* (2013.01); *H01L 51/5012* (2013.01); *H01L 51/5056* (2013.01); *H01L 51/5072* (2013.01); *H01L 51/5092* (2013.01); *H01L 51/56* (2013.01); *H01L 2251/5338* (2013.01); *H01L 2251/556* (2013.01); *H01L 2251/558* (2013.01); *Y02E 10/549* (2013.01); *Y02P 70/521* (2015.11)

(56) References Cited

U.S. PATENT DOCUMENTS

| | | | | |
|---|---|---|---|---|
| 9,102,872 | B2 * | 8/2015 | Ueno | ............... C09K 11/02 |
| 9,640,762 | B2 * | 5/2017 | Goto | ............... H05B 33/10 |
| 9,755,173 | B2 * | 9/2017 | Riegel | ............... C09K 11/06 |
| 2004/0144975 | A1 | 7/2004 | Seki et al. | |
| 2008/0100206 | A1 | 5/2008 | Kondo et al. | |
| 2010/0045174 | A1 * | 2/2010 | Okabe | ............... C08G 65/18 |
| | | | | 313/504 |
| 2015/0311443 | A1 | 10/2015 | Goto et al. | |
| 2016/0155988 | A1 | 6/2016 | Kuroki | |
| 2016/0326275 | A1 | 11/2016 | Ashikaga et al. | |
| 2018/0175298 | A1 * | 6/2018 | Sassa | ............... B05D 3/06 |
| 2018/0198095 | A1 * | 7/2018 | Sassa | ............... F26B 3/30 |

FOREIGN PATENT DOCUMENTS

| | | |
|---|---|---|
| JP | 2008-091316 A | 4/2008 |
| JP | 2008-226642 A | 9/2008 |
| JP | 2014-104409 A | 6/2014 |
| JP | 2014-229397 A | 12/2014 |
| JP | 2015-145927 A | 8/2015 |
| WO | 2006/064792 A1 | 6/2006 |
| WO | 2006/070713 A1 | 7/2006 |
| WO | 2013/180036 A1 | 12/2013 |
| WO | 2014/083938 A1 | 6/2014 |
| WO | 2014/203729 A1 | 12/2014 |
| WO | 2014/208468 A1 | 12/2014 |
| WO | 2016/039129 A1 | 3/2016 |
| WO | 2016/208588 A1 | 12/2016 |
| WO | 2016/208597 A1 | 12/2016 |

OTHER PUBLICATIONS

Communication dated Nov. 22, 2018 from the State Intellectual Property Office of the P.R.C. In counterpart Application No. 201680036302.1.

Communication dated Jan. 23, 2019, from the European Patent Office in counterpart European Application No. 16814366.7.

* cited by examiner

METHOD FOR MANUFACTURING ORGANIC ELECTRONIC ELEMENT, AND METHOD FOR FORMING ELECTRON HOLE INJECTION LAYER

CROSS REFERENCE TO RELATED APPLICATIONS

This application is a National Stage of International Application No. PCT/JP2016/068431 filed Jun. 21, 2016, claiming priority based on Japanese Patent Application No. 2015-125059 filed Jun. 22, 2015, the contents of all of which are incorporated herein by reference in their entirety.

TECHNICAL FIELD

The present invention relates to a method for manufacturing an organic electronic element and a method for forming a hole injection layer.

BACKGROUND ART

An organic electronic element, such as an organic electroluminescent element (hereinafter sometimes referred to as an "organic EL element"), an organic photoelectric conversion element, and an organic thin film transistor, includes an organic thin film having a predetermined function, and the organic thin film is supported by a substrate.

The organic thin film included in the organic electronic element is formed using a coating method as disclosed in, for example, Patent Literature 1. In a technique of Patent Literature 1, a substrate, which is an object to be coated, is first coated with an organic material for an organic thin film to form a coating film. Thereafter, the organic thin film is formed by drying the coating film.

An example of the organic thin film is a hole injection layer. For example, when the organic electronic element is an organic EL element, the hole injection layer is a layer having a function of improving hole injection efficiency from an anode layer to a light-emitting layer. The hole injection layer can be formed by the above-described coating method.

CITATION LIST

Patent Literature

Patent Literature 1: PCT International Application Publication No. 2006/064792

SUMMARY OF INVENTION

Technical Problem

In the case of forming the hole injection layer which is the organic thin film, there may be a case where heat treatment (baking treatment) as an activation processing is performed after film formation. As a method of this heat treatment, for example, heating at high temperature (for example, 230° C.) for about 15 minutes by using a hot plate is conceivable. In such a heating method, however, there is a risk of damaging the substrate when the substrate supporting the hole injection layer is a plastic substrate.

An object of the present invention is to provide a method for manufacturing an organic electronic element which can form a hole injection layer on a plastic substrate while reducing damage to a plastic substrate.

Solution to Problem

A method for manufacturing an organic electronic element according to one side of the present invention is a method for manufacturing an organic electronic element having a hole injection layer, the method includes: a hole injection layer coating film formation step of applying a hole injection layer coating liquid containing a hole injection material on a plastic substrate to form a hole injection layer coating film; and a heat treatment step of heating the hole injection layer coating film by irradiating the hole injection layer coating film with an infrared ray to form a hole injection layer. The hole injection layer coating film has absorption in a first wavelength range of 1.2 μm to 5.0 μm. The infrared ray is an infrared ray in which an 80% or more of total radiation energy of the infrared ray in a wavelength range of 1.2 μm to 10.0 μm is included in the first wavelength range.

A method for forming a hole injection layer according to another side of the present invention includes: a hole injection layer coating film formation step of applying a hole injection layer coating liquid containing a hole injection material on a plastic substrate to form a hole injection layer coating film; and a heat treatment step of heating the hole injection layer coating film by irradiating the hole injection layer coating film with an infrared ray to form the hole injection layer. The hole injection layer coating film has absorption in a first wavelength range of 1.2 μm to 5.0 μm. The infrared ray is an infrared ray in which 80% or more of total radiation energy of the infrared ray in a wavelength range of 1.2 μm to 10.0 μm is included in the first wavelength range.

In the method for manufacturing the organic electronic element and the method for forming a hole injection layer described above, the hole injection layer is obtained by forming the hole injection layer coating film, and then, heating the coating film with the infrared ray to develop an electron-accepting function. The infrared ray with which the hole injection layer coating film is irradiated is the infrared ray in which 80% of the total radiation energy of the infrared ray in the wavelength range of 1.2 μm to 10.0 μm is included in the first wavelength range. Meanwhile, the hole injection layer coating film has absorption in the first wavelength range. Thus, the infrared ray is efficiently absorbed by the hole injection layer coating film so that the hole injection layer coating film can be heat-treated in a short time. Accordingly, it is possible to shorten the time for irradiating the hole injection layer coating film with the infrared ray in the heat treatment step, and thus, it is possible to form the hole injection layer coating film while reducing damage to the plastic substrate.

In the method for manufacturing an organic electronic element and the method for forming a hole injection layer according to one embodiment, in an absorption spectrum of a plastic material constituting a plastic substrate, an integral value of the absorption spectrum in the first wavelength range is preferably smaller than an integral value of the absorption spectrum of a second wavelength range of 5.0 μm to 10.0 μm.

In this case, the infrared ray in the first wavelength range is hardly absorbed by the plastic substrate even if the infrared ray has greater radiation energy in the first wavelength range. As a result, the damage to the plastic substrate hardly occurs even if the hole injection layer coating film is irradiated with the infrared ray.

In the method for manufacturing an organic electronic element and the method for forming a hole injection layer according to one embodiment, an integral value of the first wavelength range is preferably larger than an integral value of a second wavelength range of 5.0 μm to 10.0 μm in a spectrum of a product of a radiation spectrum of the infrared ray and an absorption spectrum of the hole injection layer coating film.

In this case, the integral value of the first wavelength range is larger than the integral value of the second wavelength range in the spectrum of the product of the radiation spectrum of the infrared ray with which the hole injection layer coating film is irradiated and the absorption spectrum of the hole injection layer coating film. Thus, the hole injection layer coating film is more efficiently heated with the infrared ray. As a result, it is possible to further shorten the time of the heat treatment step to develop the electron-accepting function. Accordingly, it is possible to reduce the damage to the plastic substrate caused by the infrared ray.

In the method for manufacturing an organic electronic element and the method for forming a hole injection layer according to one embodiment, A1/(A1+A2) is preferably 0.8 or more when an integral value of the first wavelength range is A1 and an integral value of the second wavelength range is A2 in a spectrum of a product of a radiation spectrum of the infrared ray and an absorption spectrum of the hole injection layer coating film.

When A1 and A2 satisfy the above-described relational expression, it is possible to perform the heat treatment of the hole injection layer coating film in a short time while suppressing the excessive rise in temperature caused by the infrared ray absorption of the plastic substrate.

In the method for manufacturing an organic electronic element and the method for forming a hole injection layer according to one embodiment, the hole injection layer coating film may be heated by a heat source different from the infrared ray together with heating using the infrared ray in the heat treatment step. In this case, the hole injection layer coating film is efficiently heated.

In the method for manufacturing an organic electronic element and the method for forming a hole injection layer according to one embodiment, it is preferable to heat the plastic substrate such that a temperature of the plastic substrate is equal to or lower than a glass transition temperature of a material constituting the plastic substrate in the heat treatment step. Accordingly, it is possible to prevent deformation of the plastic substrate.

In the method for manufacturing an organic electronic element and the method for forming a hole injection layer according to one embodiment, the plastic substrate may have flexibility, and the heat treatment step may be performed during a course of winding the plastic substrate fed out from the plastic substrate wound around an unwinding roll onto a winding roll. In this case, the heat treatment step is carried out by a so-called roll-to-roll method.

In the method for manufacturing an organic electronic element according to one embodiment, the organic electronic element may be an organic electroluminescence element, an organic photoelectric conversion element, or an organic thin film transistor.

Advantageous Effects of Invention

According to the present invention, it is possible to provide the method for manufacturing an organic electronic element and the method for forming a hole injection layer, which can form the hole injection layer on the plastic substrate while reducing the damage to the plastic substrate.

DESCRIPTION OF EMBODIMENTS

Figure 1:
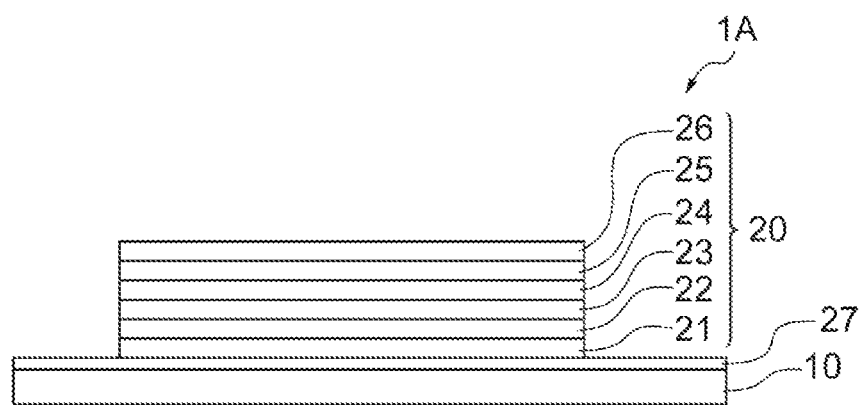
FIG. 1 is a view schematically illustrating an example of a configuration of an organic EL element which is an embodiment of an organic electronic element according to the present invention.

Hereinafter, embodiments of the present invention will be described with reference to the drawings. The same elements will be denoted by the same reference numerals. A redundant description thereof will be omitted. Dimensional ratios of the drawings do not always coincide with those of the description. In the description, terms indicating directions such as "above" and "below" are convenient terms based on a state illustrated in the drawing.

An organic electronic element according to the present embodiment is an organic electroluminescent element (hereinafter referred to as organic EL element) 1A schematically illustrated in FIG. 1. The organic EL element 1A can be suitably used for a curved or planar illumination device, for example, a planar light source used as a light source of a scanner and a display device.

As illustrated in FIG. 1, the organic EL element 1A includes a substrate 10, an anode layer 21, a hole injection layer 22, a hole transport layer 23, a light-emitting layer 24, an electron transport layer, and a cathode layer 26 which are provided from the substrate 10 side in the order. A stacked body including the anode layer 21, the hole injection layer 22, the hole transport layer 23, the light-emitting layer 24, the electron injection layer 25, and the cathode layer 26 is also referred to as an element body 20.

The hole injection layer 22, the hole transport layer 23, and the light-emitting layer 24, arranged between the anode layer 21 and the cathode layer 26 which are two electrodes, are organic thin films containing an organic material and functional layers (hereinafter also referred to as organic functional layers) having predetermined functions, respectively. The electron injection layer 25 is also a thin film and is a functional layer having a predetermined function. The electron injection layer 25 may also be an organic functional layer containing an organic material. Although not illustrated in FIG. 1, the organic functional layer deteriorates due to moisture, and thus, the organic EL element 1A is generally sealed with a sealing member (for example, glass).

The organic EL element 1A may be a bottom emission type, that is, a mode of emitting light emitted from the light-emitting layer 24 through the substrate 10 in the configuration illustrated in FIG. 1, or may be a top emission type, that is, a mode of emitting light emitted from the light-emitting layer 24 through the substrate 10 in the configuration illustrated in FIG. 1. In the following description, the organic EL element 1A is the bottom emission type unless otherwise specified.

<Substrate>

The substrate 10 is a plastic substrate and is made of a plastic material that substantially transmits visible light (for example, light having a wavelength of 360 nm to 830 nm) emitted from the light-emitting layer 24. The substrate 10 is preferably colorless and transparent with respect to the light emitted from the light-emitting layer 24.

Examples of the plastic material constituting the substrate 10 include: polyester resin polyethersulfone (PES); polyester resins such as polyethylene terephthalate (PET) and polyethylene naphthalate (PEN); polyolefin resins such as polyethylene (PE), polypropylene (PP), and cyclic polyolefin; a polyamide resin; a polycarbonate resin; a polystyrene resin; a polyvinyl alcohol resin; a saponified product of an ethylene-vinyl acetate copolymer; a polyacrylonitrile resin; an acetal resin; a polyimide resin; and an epoxy resin.

Among these resins, the polyester resin or the polyolefin resin is preferable due to high heat resistance, a low linear expansion coefficient and low manufacturing cost, and the polyethylene terephthalate or the polyethylene naphthalate is particularly preferable. One kind of these resins may be used alone, or two or more kinds of these resins may be used in combination.

Figure 2:
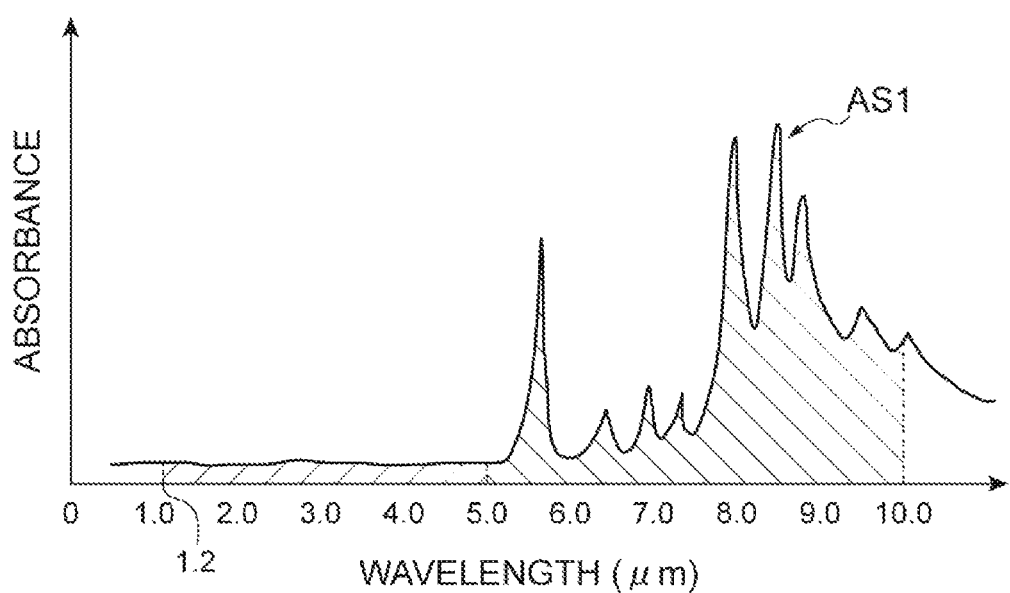
FIG. 2 is a schematic view for describing an absorption spectrum of a plastic material forming a substrate.

As schematically illustrated in FIG. 2, the main component of the substrate 10, that is, the plastic material generally has, in the absorption spectrum AS1 of the plastic material, an absorption characteristic (optical characteristic) that an integral value (the area of a hatched portion in a first wavelength range in FIG. 2) in the first wavelength range of 1.2 μm to 5.0 μm (hereinafter referred to simply as the "first wavelength range") is smaller than an integral value (the area of a hatched portion in a second wavelength range in FIG. 2) in the second wavelength range of 5.0 μm to 10 μm (hereinafter also referred to simply as the "second wavelength range"). That is, the plastic material generally tends to have more absorption with respect to the infrared rays in the second wavelength range. In FIG. 2, the abscissa represents a wavelength (μm) and the ordinate represents absorbance.

FIG. 2 is a conceptual view for describing the absorption characteristic of the plastic material according to one embodiment, and a peak position and magnitude of the absorbance are schematically illustrated. Thus, the absorbance on the ordinate represents an arbitrary unit.

The thickness of the substrate 10 is, for example, 10 μm or more and 1 mm or less although not particularly limited. The substrate 10 may be in the form of a film.

In a mode where the substrate 10 is a flexible substrate, the organic EL element 1A having the flexibility as a whole can be manufactured by a roll-to-roll method. An electrode and a drive circuit for driving the organic EL element 1A may be formed in advance on the substrate 10.

The moisture content of the substrate 10 is, for example, 100 ppm or less in one embodiment. In one embodiment, a barrier layer 27, which is a barrier film, may be provided on the surface of the substrate 10 as illustrated in FIG. 1. The barrier layer 27 is a layer configured to reduce the influence on the element body 20 when the substrate 10 contains moisture. Examples of a material of the barrier layer 27 include silicon oxide, silicon nitride, silicon oxynitride, and the like. The barrier layer 27 may have a configuration in which these films are stacked or a configuration in which the composition in the film is repeatedly changed in a film thickness direction. An example of the thickness of the barrier layer 27 is 100 nm or more and 10 μm or less.

<Anode Layer>

An electrode layer exhibiting light transparency is used for the anode layer 21. A thin film, such as metal oxide, metal sulfide and metal having high electric conductivity, can be used as the electrode exhibiting light transparency, and a thin film having high light transmittance is suitably used. For example, a thin film made of indium oxide, zinc oxide, tin oxide, ITO, indium zinc oxide (abbreviated as IZO), gold, platinum, silver, copper or the like is used for the anode layer 21. Among these, a thin film made of ITO, IZO, or tin oxide is suitably used.

A transparent conductive film made of an organic substance such as polyaniline or a derivative thereof and polythiophene or a derivative thereof may be used as the anode layer 21.

The thickness of the anode layer 21 can be appropriately determined in consideration of light transparency, electric conductivity, and the like. The thickness of the anode layer 21 is, for example, 10 nm to 10 μm, preferably 20 nm to 1 μm, and more preferably 50 nm to 500 nm.

Examples of a method for forming the anode layer 21 include a vacuum vapor deposition method, a sputtering method, an ion plating method, a plating method, a coating method, and the like.

<Hole Injection Layer>

The hole injection layer 22 is a layer having a function of improving efficiency in hole injection from the anode layer 21. A hole injection material constituting the hole injection layer 22 is classified into a low molecular weight compound and a macromolecular compound. The hole injection material may have a crosslinking group.

Examples of the low molecular weight compound include metal oxide such as vanadium oxide, molybdenum oxide, ruthenium oxide and aluminum oxide, a metal phthalocyanine compound such as copper phthalocyanine, carbon, and the like.

Examples of the macromolecular compound include: a polythiophene derivative such as polyaniline, polythiophene, polyethylene dioxythiophene (PEDOT); polypyrrole, polyphenylenevinylene, polythienylenevinylene, polyquinoline and polyquinoxaline and a derivative thereof; and a conductive polymer such as a polymer having an aromatic amine structure in a main chain or a side chain.

When the hole injection material contains the conductive polymer, the electric conductivity of the conductive polymer is preferably $1\times10^{-5}$ S/cm to $1\times10^3$ S/cm. In order to set the electric conductivity of the conductive polymer to such a range, an appropriate number of ions may be doped in the conductive polymer.

A type of ions to be doped is an anion, and examples of the anion include a polystyrene sulfonate ion, an alkylbenzene sulfonate ion, and a camphor sulfonate ion. One kind of ions to be doped may be used alone or two or more kinds thereof may be used in combination.

A conventionally known organic material having a hole transport property can be used as the hole injection material by combining this organic material with an electron-accepting material.

A heteropoly acid compound or arylsulfonic acid can be suitably used as the electron-accepting material.

The heteropoly acid compound is polyacid which has a structure in which a hetero atom is positioned at the center of a molecule and which is represented by a chemical structure of the Keggin type or the Dawson type, and is formed by condensing together an isopoly acid, which is an oxyacid of vanadium (V), molybdenum (Mo), tungsten (W) or the like, and an oxyacid of a dissimilar element. The oxyacides of the dissimilar element mainly include oxyacides of silicon (Si), phosphorus (P), and arsenic (As). Specific examples of the heteropoly acid compound include phosphomolybdic acid, silicomolybdic acid, phosphotungstic acid, phosphotungstomolybdic acid, silicotungstic acid, and the like.

Examples of the arylsulfonic acid include benzenesulfonic acid, tosylic acid, p-styrenesulfone, 2-naphthalenesulfonic acid, 4-hydroxybenzenesulfonic acid, 5-sulfosalicylic acid, p-dodecylbenzenesulfonic acid, dihexylbenzenesulfonic acid, 2,5-dihexylbenzenesulfonic acid, dibutylnaphthalenesulfonic acid, 6,7-dibutyl-2-naphthalenesulfonic acid, dodecylnaphthalenesulfonic acid, 3-dodecyl-2-naphthalenesulfonic acid, hexylnaphthalenesulfonic acid, 4-hexyl-1-naphthalenesulfonic acid, octylnaphthalenesulfonic acid, 2-octyl-1-naphthalenesulfonic acid, hexylnaphthalenesulfonic acid, 7-hexyl-1-naphthalenesulfonic acid, 6-hexyl-2-naphthalenesulfonic acid, dinonylnaphthalenesulfonic acid, 2,7-dinonyl-4-naphthalenesulfonic acid, dinonylnaphthalenedisulfonic acid, 2,7-dinonyl-4,5-naphthalenedisulfonic acid, and the like.

The heteropoly acid compound and the arylsulfonic acid may be mixed and used as the electron-accepting material.

The thickness of the hole injection layer 22 has different optimum values depending on a material to be used, and is appropriately determined in consideration of characteristics to be required, the simplicity of film formation, and the like. The thickness of the hole injection layer 22 is, for example, 1 nm to 1 µm, preferably 2 nm to 500 nm, and more preferably 5 nm to 200 nm.

The hole injection layer is formed by a coating method, for example. When the hole injection layer is formed by the coating method, activation by heat is performed after the coating film containing the hole injection material is dried. The activation means to develop an electron-accepting function that the hole injection layer needs to have.

<Hole Transport Layer>

The hole transport layer 23 has a function of receiving holes from the hole injection layer 22 (or the anode layer 21 when the hole injection layer 22 is not provided) and transporting the holes to the light-emitting layer 24.

The hole transport layer 23 contains a hole transport material. The hole transport material is not particularly limited as long as being an organic compound having a hole transport function. Specific examples of the organic compound having the hole transport function include polyvinylcarbazole or a derivative thereof, polysilane or a derivative thereof, a polysiloxane derivative having an aromatic amine residue in a side chain or a main chain, a pyrazoline derivative, an arylamine derivative, a stilbene derivative, a triphenyldiamine derivative, polyaniline or a derivative thereof, polythiophene or a derivative thereof, polypyrrole or a derivative thereof, polyarylamine or a derivative thereof, poly (p-phenylenevinylene) or a derivative thereof, a polyfluorene derivative, a macromolecular compound having an aromatic amine residue, and poly (2,5-thienylenevinylene) or a derivative thereof.

The organic compound having the hole transport function is preferably a macromolecular compound, for example, a polymer. This is because the film forming property is improved and the light emitting property of the organic EL element 1A can be made uniform if the organic compound having the hole transport function is the macromolecular compound. The polystyrene-equivalent number average molecular weight of the organic compound having the hole transport function is, for example, 10000 or more, preferably $3.0\times10^4$ to $5.0\times10^5$, and more preferably $6.0\times10^4$ to $1.2\times10^5$. The polystyrene-equivalent weight average molecular weight of the organic compound having the hole transport function is, for example, $1.0\times10^4$ or more, preferably $5.0\times10^4$ to $1.0\times10^6$, and more preferably $1.0\times10^5$ to $6.0\times10^5$.

Specifically, examples of the hole transport material include those described in Japanese Unexamined Patent Application Publication No. S63-70257, Japanese Unexamined Patent Application Publication No. S63-175860, Japanese Unexamined Patent Application Publication No. H2-135359, Japanese Unexamined Patent Application Publication No. H2-135361, Japanese Unexamined Patent Application Publication No. H2-209988, Japanese Unexamined Patent Application Publication No. H3-37992, and Japanese Unexamined Patent Application Publication No. H3-152184, and the like.

Among them, the organic compound having the hole transport function is preferably a macromolecular hole transport material such as polyvinylcarbazole or a derivative thereof, polysilane or a derivative thereof, a polysiloxane derivative having an aromatic amine residue in a side chain or a main chain, polyaniline or a derivative thereof, polythiophene or a derivative thereof, a polyfluorene derivative, a macromolecular compound having an aromatic amine residue, poly (p-phenylenevinylene) or a derivative thereof, and poly (2,5-thienylenevinylene) or a derivative thereof, and more preferably is the polyvinylcarbazole or the derivative thereof, the polysilane or the derivative thereof, the polysiloxane derivative having the aromatic amine residue in the side chain or the main chain, the polyfluorene derivative, and the macromolecular compound having the aromatic amine residue. When the organic compound having the hole transport function is the low molecular weight compound, it is preferable to use the organic compound in the state of being dispersed in a macromolecular binder.

The polyvinylcarbazole or the derivative thereof, which is the organic compound having the hole transport function, can be obtained, for example, by cation-polymerizing or radical-polymerizing a vinyl monomer.

Examples of the polysilane or the derivative thereof, which is the organic compound having the hole transport function, include compounds and the like described in Chem. Rev., Vol. 89, p 1359 (1989) or British Patent No. 2,300,196 application publication specification. As a synthesis method thereof, methods described in these documents can also be used, and particularly the Kipping method is suitably used.

As the polysiloxane or the derivative thereof, a compound having a structure of the low molecular hole transport material in a side chain or in a main chain is suitably used because a siloxane skeleton structure has almost no hole transport property. In particular, a compound having a hole transporting aromatic amine residue in a side chain or a main chain can be exemplified as the polysiloxane or the derivative thereof.

The organic compound having the hole transport property is preferably a polymer having a fluorenediyl group represented by the following Formula (1). It is because the hole injection efficiency is improved and the current density at the time of driving increases when such a polymer is brought into contact with an organic compound having a condensed ring or a plurality of aromatic rings to form the hole transport layer 23 of the organic EL element 1A.

[Chemical Formula 1]

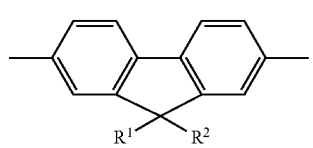

(1)

In Formula (1), $R^1$ and $R^2$ may be the same or different from each other, and each independently represent a hydrogen atom, an alkyl group, an alkoxy group, an aryl group, or a monovalent heterocyclic group. Examples of the alkyl group include an alkyl group having the number of carbon atoms of 1 to 10. Examples of the alkoxy group include an alkoxy group having the number of carbon atoms of 1 to 10. Examples of the aryl group include a phenyl group and a naphthyl group. Examples of the monovalent heterocyclic group include a pyridyl group, and the like. The aryl group and the monovalent heterocyclic group may have a substituent, and examples of the substituent include an alkyl group having the number of carbon atoms of 1 to 10 and an alkoxy group having the number of carbon atoms of 1 to 10 from the viewpoint of improving solubility of the macromolecular compound.

The substituent of the aryl group and the monovalent heterocyclic group may have a crosslinking group. Examples of the crosslinking group include a vinyl group, an ethynyl group, a butenyl group, an acryloyl group, an acryloyloxyalkyl group, an acryloylamido group, a methacryloyl group, a methacryloyloxyalkyl group, a methacryloylamido group, a vinyl ether group, a vinyl amino group, a silanol group, and a group (for example, a cyclopropyl group, a cyclobutyl group, an epoxy group, an oxetane group, a diketene group, an episulfide group, a lactone group having a three-membered ring or a four-membered ring, a lactam group having a three-membered ring or a four-membered ring, and the like) having a small-membered ring (for example, cyclopropane, cyclobutane, epoxide, oxetane, diketene, episulfide, and the like).

Specific examples of the preferable fluorenediyl group are illustrated below.

[Chemical Formula 2]

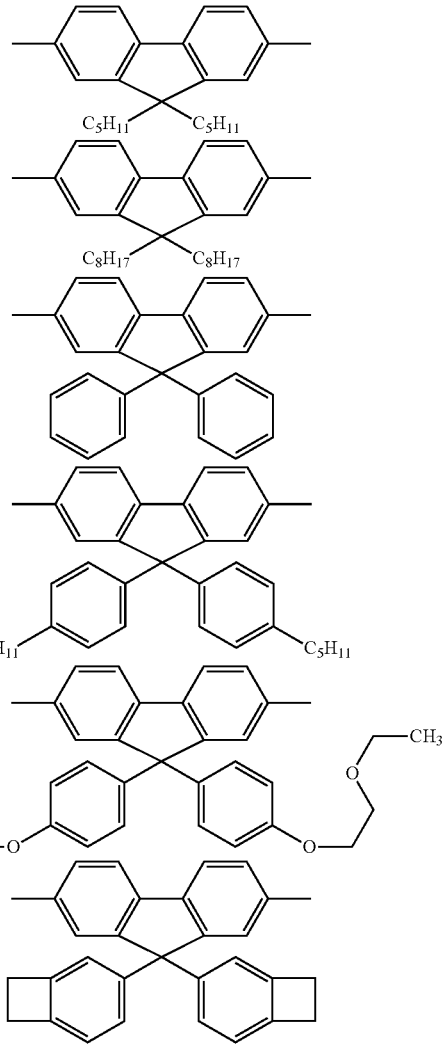

The particularly preferable organic compound having the hole transport function is a polymer that includes the fluorenediyl group and a structure having an aromatic tertiary amine compound as a repeating unit, for example, a polyarylamine polymer.

Examples of the repeating unit having the structure of the aromatic tertiary amine compound include the repeating unit represented by the following Formula (2).

[Chemical Formula 3]

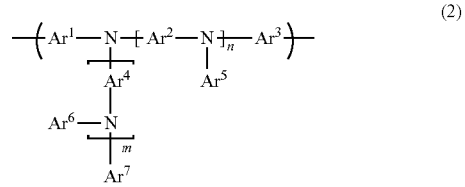

(2)

In Formula (2), $Ar^1$, $Ar^2$, $Ar^3$ and $Ar^4$ each independently represent an arylene group or a divalent heterocyclic group.

Ar$^5$, Ar$^6$ and Ar$^7$ each independently represent an aryl group or a monovalent heterocyclic group. Alternatively, Ar$^6$ and Ar$^7$ may form a ring together with nitrogen atoms to which Ar$^6$ and Ar$^7$ are bonded. Further, m and n each independently represent 0 or 1.

Examples of the arylene group include a phenylene group and the like. Examples of the divalent heterocyclic group include a pyridinediyl group and the like. These groups may have a substituent.

Examples of the aryl group include a phenyl group and a naphthyl group. Examples of the monovalent heterocyclic group include a pyridyl group and the like. These groups may have a substituent.

Examples of the monovalent heterocyclic group include a thienyl group, a furyl group, a pyridyl group, and the like.

From the viewpoint of solubility of the macromolecular compound, the substituent that may be included in the arylene group, the aryl group, the divalent heterocyclic group, and the monovalent heterocyclic group is preferably an alkyl group, an alkoxy group, and an aryl group, and more preferably the alkyl group. Examples of the alkyl group include an alkyl group having the number of carbon atoms of 1 to 10. Examples of the alkoxy group include a group having the number of carbon atoms of 1 to 10. Examples of the aryl group include a phenyl group and a naphthyl group.

The substituent may have a crosslinking group. Examples of the crosslinking group include a vinyl group, an ethynyl group, a butenyl group, an acryloyl group, an acryloyloxyalkyl group, an acryloylamido group, a methacryloyl group, a methacryloyloxyalkyl group, a methacryloylamido group, a vinyl ether group, a vinyl amino group, a silanol group, and a group (for example, a cyclopropyl group, a cyclobutyl group, an epoxy group, an oxetane group, a diketene group, an episulfide group, a lactone group having a three-membered ring or a four-membered ring, a lactam group having a three-membered ring or a four-membered ring, and the like) having a small-membered ring (for example, cyclopropane, cyclobutane, epoxide, oxetane, diketene, episulfide, and the like).

Ar$^1$, Ar$^2$, Ar$^3$ and Ar$^4$ are preferably an arylene group and more preferably a phenylene group. Ar$^5$, Ar$^6$ and Ar$^7$ are preferably an aryl group and more preferably a phenyl group.

Further, the carbon atom in Ar$^2$ and the carbon atom in Ar$^3$ may be directly bonded or may be bonded through a divalent group such as a group represented by —O— and a group represented by —S—.

From the viewpoint of easy synthesis of the monomer, m and n are preferably 0.

Specific examples of the repeating unit represented by Formula (2) include a repeating unit represented by the following formula and the like.

[Chemical Formula 4]

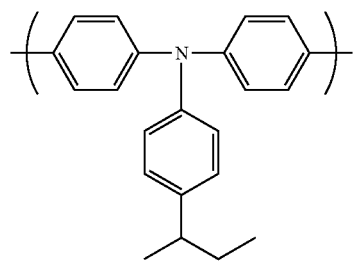

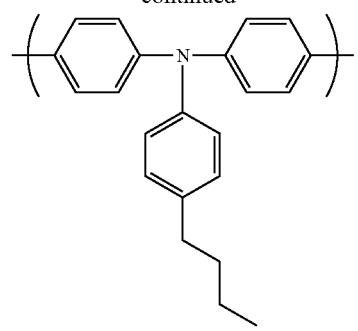

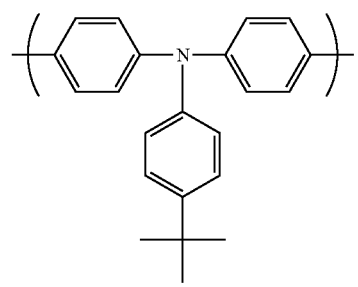

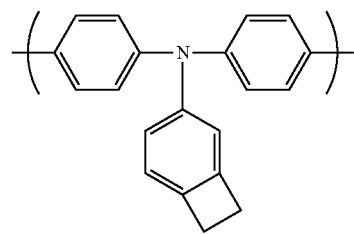

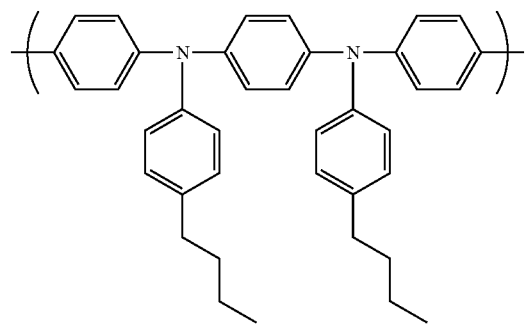

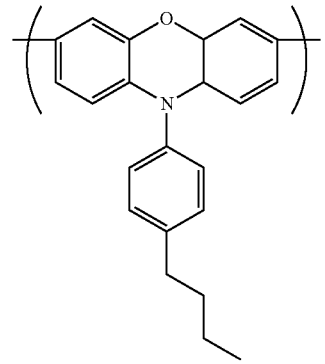

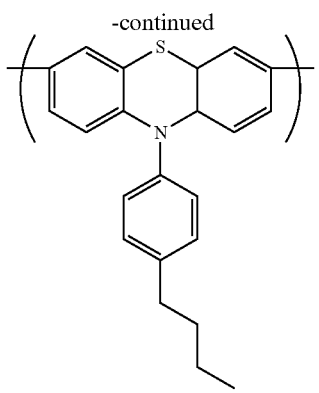

When the organic compound having the hole transport function does not have the crosslinking group, a crosslinking agent is further used as a material having the crosslinking group. Examples of the crosslinking agent include a compound having a polymerizable group that is selected from the group consisting of a vinyl group, an ethynyl group, a butenyl group, an acryloyl group, an acryloyloxyalkyl group, an acryloylamido group, a methacryloyl group, a methacryloyloxyalkyl group, a methacryloylamido group, a vinyl ether group, a vinyl amino group, a silanol group, a cyclopropyl group, a cyclobutyl group, an epoxy group, an oxetane group, a diketene group, an episulfide group, a lactone group having a three-membered ring or a four-membered ring, and a lactam group having a three-membered ring or a four-membered ring. The crosslinking agent is preferably a multifunctional acrylate, and examples thereof include dipentaerythritol hexaacrylate (DPHA), tris pentaerythritol octaacrylate (TPEA), and the like.

A solvent used for film formation using a solution is not particularly limited as long as the solvent dissolves the hole transport material. Examples of the solvent include a chloride solvent such as chloroform, methylene chloride, and dichloroethane, an ether solvent such as tetrahydrofuran, an aromatic hydrocarbon solvent such as toluene and xylene, a ketone solvent such as acetone and methyl ethyl ketone, and an ester solvent such as ethyl acetate, butyl acetate, and ethyl cellosolve acetate.

Examples of a film formation method using the solution include a coating method.

As a macromolecular binder used in the mixed solution, a binder that does not excessively inhibit charge transport is preferable, and further, a binder having low absorption to visible light is suitably used. Examples of the macromolecular binder include polycarbonate, polyacrylate, polymethyl acrylate, polymethyl methacrylate, polystyrene, polyvinyl chloride, polysiloxane, and the like.

The thickness of the hole transport layer 23 has different optimum values depending on a material to be used and may be selected such that drive voltage and light emission efficiency have appropriate values. The hole transport layer 23 needs to have at least the thickness of a degree such that no pinholes occur, and there is a risk that the drive voltage of the organic EL element 1A may increase if the hole transport layer 23 is too thick. The thickness of the hole transport layer 23 is, for example, 1 nm to 1 μm, preferably 2 nm to 500 nm, and more preferably 5 nm to 200 nm.

<Light-Emitting Layer>

The light-emitting layer 24 generally contains an organic substance that mainly emits at least one of fluorescence and phosphorescence, or the organic substance and a dopant material for a light-emitting layer that assists the organic substance. The dopant material for the light-emitting layer is added, for example, for improving the light emission efficiency or changing a light emission wavelength. From the viewpoint of solubility, the organic substance is preferably a macromolecular compound. The light-emitting layer 24 preferably contains a macromolecular compound having a polystyrene-equivalent number average molecular weight of $10^3$ to $10^8$. Examples of a light-emitting material constituting the light-emitting layer 24 include an organic substance that mainly emits at least one of fluorescence and phosphorescence such as the following dye material, metal complex material, and macromolecular material, and the dopant material for the light-emitting layer.

(Dye Material)

Examples of the dye material include a cyclopentamine derivative, a tetraphenylbutadiene derivative, a triphenylamine derivative, an oxadiazole derivative, a pyrazoloquinoline derivative, a distyrylbenzene derivative, a distyrylarylene derivative, a pyrrole derivative, a thiophene ring compound, a pyridine ring compound, a perinone derivative, a perylene derivative, an oligothiophene derivative, an oxadiazole dimer, a pyrazoline dimer, a quinacridone derivative, a coumarin derivative, and the like.

(Metal Complex Material)

Examples of the metal complex material include a metal complex having a rare-earth metal such as Tb, Eu and Dy, or Al, Zn, Be, Pt, and Ir as a center metal and having an oxadiazole, thiadiazole, phenylpyridine, phenylbenzimidazole, or quinoline structure as a ligand. Examples of the metal complex include a metal complex having light emission from a triplet excited state such as an iridium complex and a platinum complex, an aluminum quinolinol complex, a benzoquinolinol beryllium complex, a benzoxazolyl zinc complex, a benzothiazole zinc complex, an azomethyl zinc complex, a porphyrin zinc complex, a phenanthroline europium complex, and the like.

(Macromolecular Material)

Examples of the macromolecular material include a polyparaphenylenevinylene derivative, a polythiophene derivative, a polyparaphenylene derivative, a polysilane derivative, a polyacetylene derivative, a polyfluorene derivative, a polyvinyl carbazole derivative, a material in which the dye material and the metal complex material are polymerized, and the like.

(Dopant Material for Light-Emitting Layer)

Examples of the dopant material for the light-emitting layer include a perylene derivative, a coumarin derivative, a rubrene derivative, a quinacridone derivative, a squalium derivative, a porphyrin derivative, a styryl dye, a tetracene derivative, a pyrazolone derivative, decacyclene, phenoxazone, and the like.

The thickness of the light-emitting layer 24 is generally about 2 nm to 200 nm. The light-emitting layer 24 is formed, for example, by a coating method using a coating liquid (for example, an ink) containing the light-emitting material as described above. A solvent of the coating liquid containing the light-emitting material is not particularly limited as long as the solvent dissolves the light-emitting material, and examples thereof include a solvent of a coating liquid for forming the hole transport layer 23.

<Electron Injection Layer>

The electron injection layer 25 has a function of improving efficiency in electron injection from the cathode layer 26. An optimum material is appropriately selected depending on a type of the light-emitting layer 24 as a material constituting the electron injection layer 25. Examples of the material constituting the electron injection layer 25 include alkali metal, alkaline earth metal, an alloy containing at least one or more kinds of the alkali metal and the alkaline earth metal, oxides, halides, and carbonates of the alkali metal or the alkaline earth metal, or a mixture of these substances. Examples of the alkali metal and the oxides, halides, and carbonates of the alkali metal include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, lithium carbonate, and the like. In addition, examples of the alkaline earth metal and the oxides, halides and carbonates of the alkaline earth metal include magnesium, calcium, barium, strontium, magnesium oxide, magnesium fluoride, calcium oxide, calcium fluoride, barium oxide, barium fluoride, strontium oxide, strontium fluoride, magnesium carbonate, and the like.

In addition to this, a layer in which a conventionally-known organic material having an electron transport property and an organic metal complex including alkali metal are mixed can be used as the electron injection layer.

Examples of the conventionally-known material having the electron transport property include a compound having a fused aryl ring such as naphthalene and anthracene and a derivative thereof, a styryl aromatic ring derivative represented by 4,4-bis(diphenyl ethenyl)biphenyl, a perylene derivative, a perinone derivative, a coumarin derivative, a naphthalimide derivative, a quinone derivative such as anthraquinone, naphthoquinone, diphenoquinone, anthraquinodimethane, tetracyanoanthraquinodimethane, a phosphorus oxide derivative, a carbazole derivative, and an indole derivative, a quinolinol complex such as tris(8-quinolinolato) and aluminum (II), and a hydroxyazole complex such as a hydroxyphenyloxazole complex, an azomethine complex, a tropolone metal complex, and a flavonol metal complex, a compound having a heteroaryl ring that includes electron-accepting nitrogen, and the like.

The electron-accepting nitrogen represents a nitrogen atom forming multiple bonds with an adjacent atom. Since the nitrogen atom have a high electronegativity, the multiple bond also has the electron-accepting property. Accordingly, the heteroaryl ring having the electron-accepting nitrogen has high electron affinity. Examples of the compound having the heteroaryl ring structure having the electron-accepting nitrogen include a benzimidazole derivative, a benzthiazole derivative, an oxadiazole derivative, a thiadiazole derivative, a triazole derivative, a pyridine derivative, a pyrazine derivative, a phenanthroline derivative, a quinoxaline derivative, a quinoline derivative, a benzoquinoline derivative, an oligopyridine derivative such as bipyridine and terpyridine, a quinoxaline derivative, a naphthyridine derivative, a phenanthroline derivative, and the like as preferable compounds.

Specific examples of the organic metal complex compound include 8-quinolinolithium, 8-quinolinol sodium, 8-quinolinol potassium, 8-quinolinol rubidium, 8-quinolinol cesium, benzo-8-quinolinol lithium, benzo-8-quinolinol sodium, benzo 8-quinolinol potassium, benzo 8-quinolinol rubidium, benzo 8-quinolinol cesium, 2-methyl-8-quinolinol lithium, 2-methyl-8-quinolinol sodium, 2-methyl-8-quinolinol potassium, 2-methyl-8-quinolinol rubidium, and 2-methyl-8-quinolinol cesium as examples of the organic metal complex including alkali metal.

In addition to this, an ionic polymer compound containing an alkali metal salt in a side chain described in PCT international Application Publication No. 12/133229 and the like can also be used as the electron injection layer.

The electron injection layer 25 may be constituted as a stacked body in which two or more layers are stacked, and examples thereof include LiF/Ca or the like.

The electron injection layer 25 can be formed by a predetermined known method such as a vapor deposition method, a sputtering method, and a printing method. The thickness of the electron injection layer 25 is preferably about 1 nm to 1 μm.

<Cathode Layer>

A material of the cathode layer 26 is preferably a material which has a small work function, enables easy injection of electrons into the light-emitting layer 24, and has high electric conductivity. It is preferable to reflect the light, emitted from the light-emitting layer 24, to the anode layer 21 side with the cathode layer 26 in order to improve the light emission efficiency in the organic EL element 1A that emits light from the anode layer 21 side. Thus, a material having a high visible light reflectance is preferable as the material of the cathode layer 26.

Examples of the material of the cathode layer 26 include alkali metal, alkaline earth metal, transition metal, a group 13 metal in the periodic table, and the like. For example, it is possible to use metal such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium, an alloy containing two or more kinds of the above-described metal, an alloy containing one or more kinds of the above-described metal and one or more kinds of gold, silver, platinum, copper, manganese, titanium, cobalt, nickel, tungsten and tin, graphite, a graphite interlayer compound or the like as the material of the cathode layer 26. Examples of the alloy include a magnesium-silver alloy, a magnesium-indium alloy, a magnesium-aluminum alloy, an indium-silver alloy, a lithium-aluminum alloy, a lithium-magnesium alloy, a lithium-indium alloy, a calcium-aluminum alloy, and the like.

A transparent conductive electrode made of a conductive metal oxide and a conductive organic material or the like can be used as the cathode layer 26.

Specifically, examples of the conductive metal oxide include indium oxide, zinc oxide, tin oxide, ITO, and IZO, and examples of the conductive organic substance include polyaniline or a derivative thereof, polythiophene or a derivative thereof, and the like. The cathode layer 26 may be constituted as a stacked body in which two or more layers are stacked. There is a case where the electron injection layer is used as the cathode layer 26.

The thickness of the cathode layer 26 is appropriately set in consideration of electric conductivity and durability. The thickness of the cathode layer 26 is, for example, 10 nm to 10 μm, preferably 20 nm to 1 μm, and more preferably 50 nm to 500 nm.

Examples of a method for forming the cathode layer 26 include a vacuum vapor deposition method, a sputtering method, a lamination method of thermocompression-bonding a metal thin film, a coating method, and the like.

[Method for Manufacturing Organic EL Element]

Next, a method for manufacturing the organic EL element 1A will be described.

In the case of manufacturing the organic EL element 1A, first, the substrate 10 is heated and dried (substrate drying step S10). Thereafter, the element body 20 is formed on the dried substrate 10 (element body formation step S20). The element body 20 is formed by performing a step of forming the anode layer 21 on the dried substrate 10 (anode layer formation step S21), a step of forming the hole injection layer 22 on the anode layer 21 (a hole injection layer formation step S22), a step of forming the hole transport layer 23 on the hole injection layer 22 (a hole transport layer formation step S23), a step of forming the light-emitting layer 24 on the hole transport layer 23 (a light emitting layer formation step S24), a step of forming the electron injection layer 25 on the light-emitting layer 24 (an electron injection layer formation step S25), and a step of forming the cathode layer 26 on the electron injection layer 25 (a cathode layer formation step S26) in this order. In the case of forming the element body 20, each layer can be formed by each formation method exemplified in the description of each layer.

As described above, for example, when the organic EL element 1A is sealed with the sealing member, a sealing step may be performed after the cathode layer formation step S26.

Figure 3:
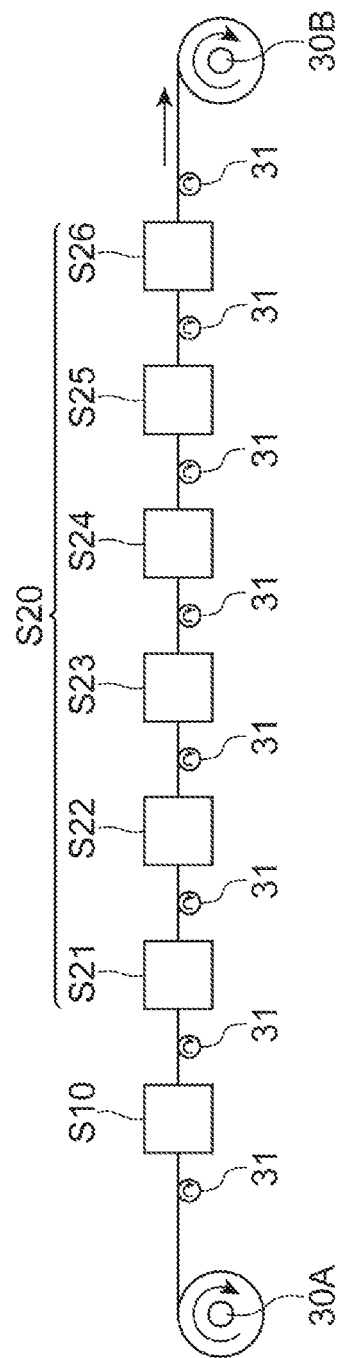
FIG. 3 is a schematic view of a method for manufacturing the organic EL element by a roll-to-roll method.

In the mode in which the substrate 10 is the flexible substrate, the roll-to-roll method can be adopted as schematically illustrated in FIG. 3. In the case of manufacturing the organic EL element 1A by the roll-to-roll method, the substrate 10 may be dried and the respective layers constituting the element body 20 may be formed sequentially from the substrate 10 side while continuously conveying the elongated flexible substrate 10, which is stretched between an unwinding roll 30A and a winding roll 30B, by a conveying roller 31. Alternatively, the unwinding roll and the winding roll may be installed in front and behind each of the steps constituting the substrate drying step S10 and the element body formation step S20 to perform each of the steps by the roll-to-roll method. Alternatively, the roll-to-roll method may be performed by installing the unwinding roll and the winding roll in front and behind some of a plurality of consecutive steps.

When some of the manufacturing steps of the organic EL element 1A are performed by the roll-to-roll method, for example, the flexible substrate 10 may be cut at a predetermined portion after the last step performed by the roll-to-roll method, and the remaining steps may be performed to manufacture the organic EL element 1A by a single substrate method.

Next, the substrate drying step S21 in the above-described method for manufacturing the organic EL element 1A will be described in detail.

[Substrate Drying Step]

Figure 4:
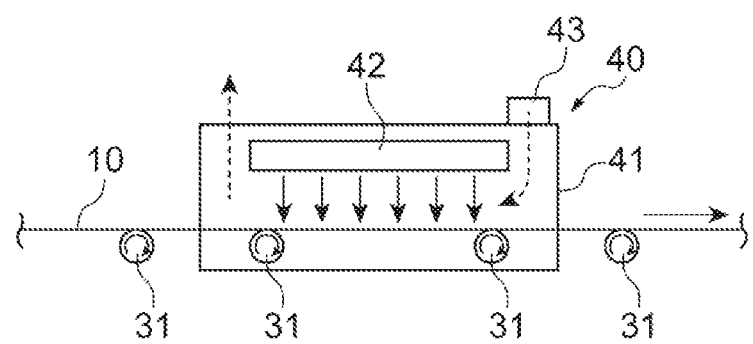
FIG. 4 is a schematic view illustrating an example of a substrate drying step.

An embodiment of a substrate drying method in the substrate drying step S10 will be described regarding a case where the substrate drying step S10 is performed by the roll-to-roll manner as illustrated in FIG. 4. In FIG. 4, a portion corresponding to the substrate drying step S10 is selected and schematically illustrates among the manufacturing steps of the organic EL element 1A by the roll-to-roll method conceptually illustrated in FIG. 3. In the substrate drying step S10, for example, the substrate 10 is dried such that the moisture content in the substrate 10 is 100 ppm or less.

A heat treatment device 40 illustrated in FIG. 4 is used in the substrate drying step S10. The heat treatment device 40 is a device that irradiates the substrate 10 with infrared rays to heat the substrate 10, and is provided on a conveyance path of the substrate 10 such that the substrate 10 passes through the inside of the heat treatment device 40.

The heat treatment device 40 has an infrared irradiation unit 42 arranged in a heat treatment furnace 41 so as to face a main surface (the main surface on a side where the element body 20 is formed) of the substrate 10.

The infrared irradiation unit 42 outputs the infrared rays having a wavelength range of 1.2 μm to 10.0 μm. The infrared rays output by the infrared irradiation unit 42 will be referred to as a first infrared ray, and a radiation spectrum of the first infrared ray will be referred to as a radiation spectrum RS 1.

Conditions to be satisfied by the radiation spectrum RS1 are as follows. That is, the radiation spectrum RS1 is a radiation spectrum in which an integral value of the radiation spectrum RS1 in a first wavelength range of 1.2 μm to 5.0 μm (hereinafter sometimes referred to simply as the "first wavelength range") is larger than an integral value of the radiation spectrum RS1 in a second wavelength range of 5.0 μm to 10.0 μm (hereinafter sometimes referred to simply as the "second wavelength range").

That is, the first infrared ray has greater radiation energy in the first wavelength range. For example, the first infrared ray preferably has 80% or more radiation energy in the first wavelength range out of the total radiation energy in a wavelength range of 1.2 μm to 10.0 μm. In one embodiment, a maximum radiation intensity in the first wavelength range can be a maximum radiation intensity in the wavelength range 1.2 μm to 10.0 μm.

A configuration of the infrared irradiation unit 42 is not particularly limited as long as the infrared irradiation unit 42 can output the first infrared ray having the radiation spectrum RS1. The infrared irradiation unit 42 has, for example, a heater capable of emitting infrared rays and a wavelength filter (for example, an infrared filter), and may be configured to output the first infrared ray having the radiation spectrum RS1 out of the infrared rays output from the heater using the wavelength filter.

The heat treatment device 40 may be configured so as to be capable of adjusting the dew-point temperature inside the heat treatment furnace 41. The heat treatment device 40 may be configured so as to be capable of adjusting an atmosphere gas inside the heat treatment furnace 41.

In the substrate drying method using the heat treatment device 40, the substrate 10 inside the heat treatment device 40 is irradiated with the first infrared ray from the infrared irradiation unit 42 to heat and dry the substrate 10.

Figure 5:
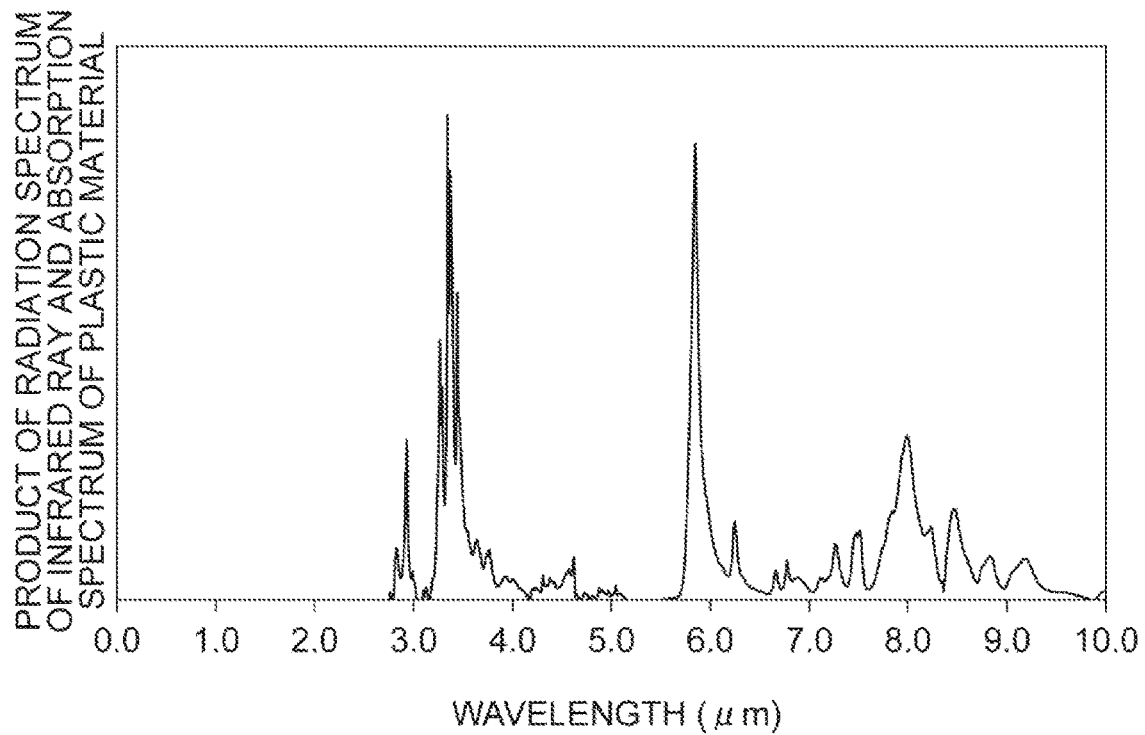
FIG. 5 is a view illustrating an example of a spectrum of a product of a radiation spectrum of an infrared ray and an absorption spectrum of a plastic material constituting a plastic substrate.

In one embodiment, when the integral value (absorption amount) in the first wavelength range is B1 and the integral value (absorption amount) in the second wavelength range is B2 in a spectrum (see FIG. 5) of a product of the radiation spectrum RS1 of the first infrared ray output from the infrared irradiation unit 42 and an absorption spectrum of the plastic material constituting the substrate 10, a substrate drying condition is preferably a condition that B1/(B1+B2) satisfies 0.2 or more. FIG. 5 is an example of the spectrum of the product described above. In FIG. 5, the abscissa represents the wavelength (μm), and the ordinate represents the product of the radiation spectrum RS1 of the first infrared ray and the absorption spectrum of the plastic material constituting the substrate 10. The unit of the ordinate represents an arbitrary unit.

In order to perform such heating, for example, the radiation spectrum RS1 of the first infrared ray emitted from the infrared irradiation unit 42 may be adjusted such that B1/(B1+B2) satisfies 0.2 or more. The radiation spectrum RS1 of the first infrared ray can be adjusted according to the manner in which the temperature adjustment of the heater and the infrared filter are combined.

An example of drying time (irradiation time of the first infrared ray) of the substrate 10 is within 10 minutes although the time also depends on the intensity of infrared rays to be emitted.

A heat source different from the infrared ray may be used in combination at the time of heating the substrate 10.

Examples of the heat source include hot air, heat generated by a lamp of the infrared irradiation unit 42, and the like. In FIG. 4, a mode in which a hot air supplier 43 that supplies hot air is attached to the heat treatment furnace 41 is illustrated as an example. The hot air supplier 43 is attached to the heat treatment furnace 41 such that the hot air flows in parallel to a conveying direction of the substrate 10 as indicated by a broken-line arrow of FIG. 4, for example.

At the time of drying the substrate 10, the substrate 10 is dried by adjusting the distance between the infrared irradiation unit 42 and the substrate 10, the heating time, the irradiation intensity of the infrared ray and the like, such that the temperature of the substrate 10 is equal to or lower than glass transition temperature (Tg) of a material constituting the substrate.

Subsequently, a description will be given regarding a method for forming an organic functional layer using infrared heating together with a coating liquid containing a material having a crosslinking group (having a polymerizable group), as one embodiment in which the organic functional layer is formed by the coating method, by exemplifying the case of forming the hole transport layer 23 which is one of the organic functional layers.

[Hole Transport Layer Formation Step]

Figure 6:
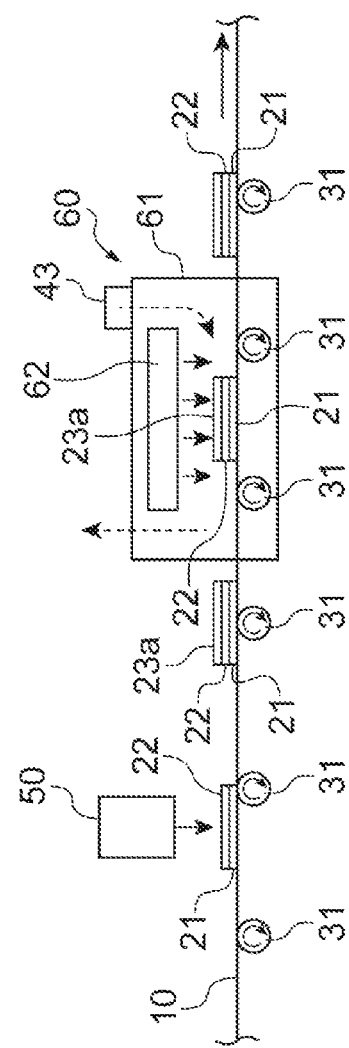
FIG. 6 is a schematic view illustrating an example of a hole transport layer formation step.

As illustrated in FIG. 6, a case where the hole transport layer 23 is formed by the roll-to-roll method will be described. In FIG. 6, a portion corresponding to the hole transport layer formation step S23 is selected and schematically illustrated among the manufacturing steps of the organic EL element 1A by the roll-to-roll method conceptually illustrated in FIG. 3, and a portion corresponding to the other steps is not illustrated.

In the method for manufacturing the organic EL element 1A illustrated in FIG. 3, the hole transport layer 23 is formed after forming the hole injection layer 22. Thus, FIG. 6 illustrates a state where the hole transport layer 23 is formed while conveying the anode layer 21 and the hole injection layer 22 formed at predetermined positions of the elongated substrate 10. In FIG. 6, a layer configuration on the substrate 10 is illustrated in an enlarged manner for the convenience of description.

A coating device 50 and a heat treatment device 60 schematically illustrated in FIG. 6 are used in a method for forming the hole transport layer 23 as the organic thin film.

The coating device 50 is a device that applies a coating liquid, that forms the hole transport layer 23 and has a crosslinking group-containing material, onto the hole injection layer 22 formed on the substrate 10 via the hole injection layer formation step S22, on the conveyance path of the substrate 10. The coating device 50 may be any type as long as being provided in accordance with a coating method (a method of applying a prepared coating liquid).

Examples of the coating method that can be used in the roll-to-roll method include a slit coating method (die coating method), a micro-gravure coating method, a gravure coating method, a bar coating method, a roll coating method, a wire bar coating method, a spray coating method, a screen printing method, a flexographic printing method, an offset printing method, an inkjet printing method, a nozzle printing method, and the like. Examples of a method that can be used in a sheet-to-sheet method include a spin coating method, a casting method and the like in addition to the above-described methods. For example, when the coating method is the inkjet printing method, the coating device 50 may be an inkjet device including an inkjet nozzle.

The heat treatment device 60 is a device that performs heat treatment, by irradiation of infrared rays, on a coating film 23a made of the coating liquid applied from the coating device 50. The heat treatment device 60 is provided on the conveyance path of the substrate 10 such that the substrate 10 passes through the inside of the heat treatment device 40.

The heat treatment device 60 has an infrared irradiation unit 62 arranged in a heat treatment furnace 61 so as to face the main surface (the main surface on the side where the element body 20 is formed) of the substrate 10.

The infrared rays output by the infrared irradiation unit 62 will be referred to as a second infrared ray, and a radiation spectrum of the second infrared ray will be referred to as a radiation spectrum RS2. The second infrared ray includes infrared rays having a wavelength range of 1.2 µm to 10.0 µm. A shape of the radiation spectrum RS2 may be the same as or different from a shape of the radiation spectrum RS1.

Conditions to be satisfied by the radiation spectrum RS2 are as follows. That is, the radiation spectrum RS2 has a wavelength (maximum peak wavelength) in the first wavelength range of 1.2 µm to 5.0 µm, corresponding to the maximum radiation intensity in the wavelength range 1.2 µm to 10.0 µm.

In one embodiment, an integral value of the first wavelength range of 1.2 µm to 5.0 µm is larger than an integral value of the second wavelength range of 5.0 µm to 10.0 µm in the radiation spectrum RS2.

That is, the second infrared ray has the greater radiation energy in the first wavelength range in one embodiment. For example, the radiation spectrum RS2 has 80% or more radiation energy in the first wavelength range out of the total radiation energy in the wavelength range of 1.2 µm to 10.0 µm. In one embodiment, a maximum radiation intensity in the first wavelength range of the second infrared ray can be a maximum radiation intensity in the wavelength range 1.2 µm to 10.0 µm.

A configuration of the infrared irradiation unit 62 is not particularly limited as long as the infrared irradiation unit 62 can output the second infrared ray having the radiation spectrum RS2. For example, the infrared irradiation unit 62 may have a heater capable of emitting infrared rays and a wavelength filter (for example, an infrared filter), in a similar manner to the case of the infrared irradiation unit 42.

The heat treatment device 60 can have the same configuration as the configuration of the heat treatment device 40 except a point of emitting the second infrared ray from the infrared irradiation unit 62. The heat treatment device 60 may include, for example, a heat source different from the irradiation of the infrared ray, in a similar manner to the heat treatment device 40. An example of such a heat source is the hot air supplier 43 similarly to the case of the heat treatment device 40.

In the hole transport layer formation step S23, the coating liquid, that forms the hole transport layer 23 and has the crosslinking group-containing material, is applied onto the hole injection layer 22 by the coating device 50 to form the coating film 23a (a coating film formation step). Next, the coating film 23a, which has been conveyed inside the heat treatment device 60 through the conveyance using the conveying roller 31, is irradiated with the second infrared ray from the infrared irradiation unit 62 to heat the coating film 23a, and the crosslinking group is crosslinked, thereby forming the hole transport layer 23 (an organic functional layer formation step).

The coating liquid applied from the coating device 50 is a coating liquid that contains the hole transport material (the organic compound having the hole transport function) as exemplified in the description of the hole transport layer 23 and has the material containing the crosslinking group. As described above, the crosslinking group may be included in the organic compound having the hole transport function. When the organic compound having the hole transport function does not include the crosslinking group, the crosslinking agent may be used as the material having the crosslinking group as described above.

Figure 7:
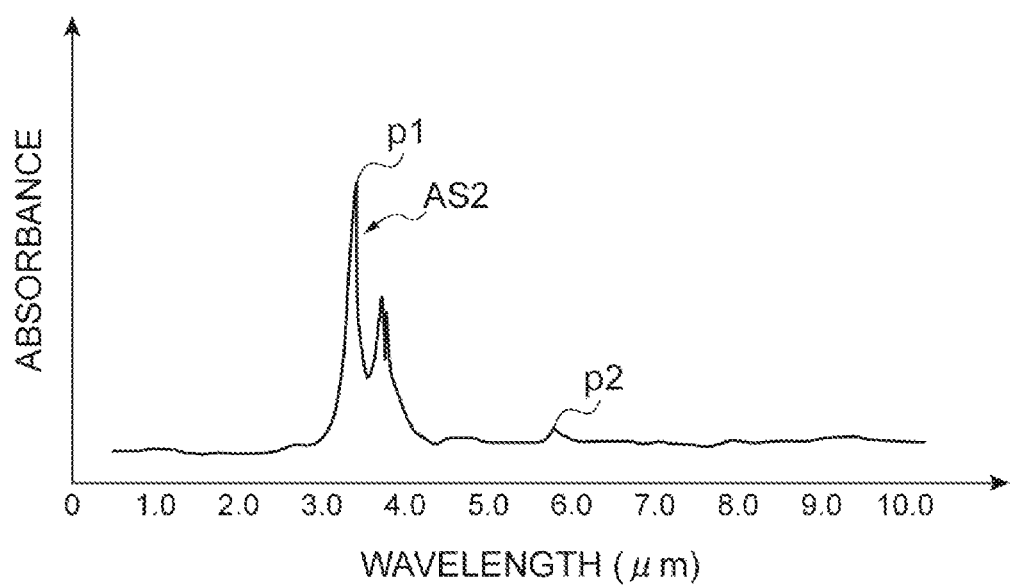
FIG. 7 is a schematic view for describing an absorption spectrum of a coating film.

The coating film 23a has absorption in the wavelength range of 1.2 µm to 10.0 µm as in an absorption spectrum AS2 of the coating film 23a illustrated in FIG. 7. The coating film 23a has the wavelength (maximum peak wavelength) corresponding to a maximum absorption peak p in the first wavelength range of 1.2 µm to 5.0 µm, in a region of the wavelength range of 1.2 µm to 10.0 µm in the absorption spectrum AS2 of the coating film 23a.

There is a case where the coating film 23a has an absorption peak p2 in the second wavelength range of 5.0 µm to 10.0 µm as illustrated in FIG. 7.

Figure 8:
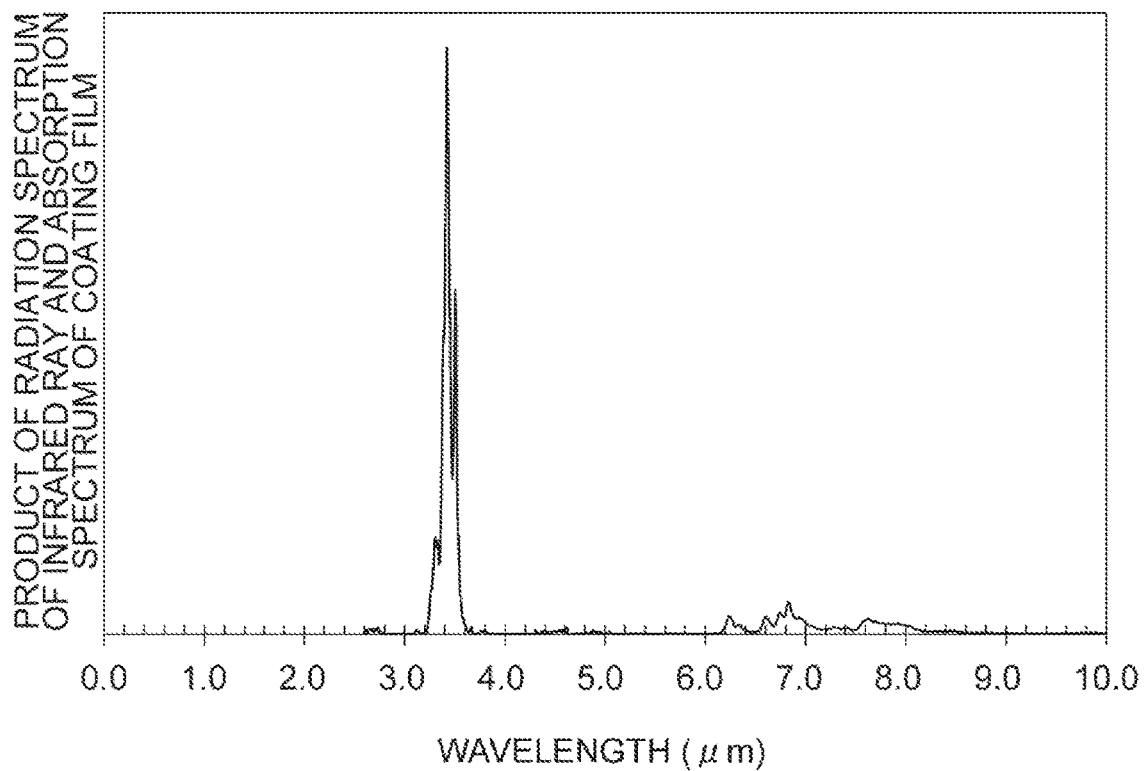
FIG. 8 is a view illustrating an example of a spectrum of a product of the radiation spectrum of the infrared ray and the absorption spectrum of the coating film which forms the hole transport layer.

In one embodiment, when the integral value (absorption amount) in the first wavelength range of 1.2 µm to 5.0 µm is C1 and the integral value (absorption amount) in the second wavelength range of 5.0 µm to 10.0 µm is C2 in a spectrum (see FIG. 8) of a product of the radiation spectrum RS2 of the second infrared ray and the absorption spectrum AS2 of the coating film 23a illustrated in FIG. 7, $C1/(C1+C2)$ preferably satisfies 0.6 or more as a heating condition at the time of performing heating by irradiating the coating film 23a with the second infrared ray. FIG. 8 is an example of the spectrum of the product described above. In FIG. 8, the abscissa represents the wavelength (µm), and the ordinate represents the product of the radiation spectrum RS2 of the second infrared ray and the absorption spectrum AS2 of the coating film 23a. The unit of the ordinate represents an arbitrary unit.

Such heating can be performed by adjusting the radiation spectrum RS2 of the second infrared ray, emitted from the infrared irradiation unit 62, according to an absorption characteristic of the coating film 23a so as to satisfy $C1/(C1+C2) \geq 0.6$, for example.

An example of irradiation time of the second infrared ray to the coating film 23a is within 10 minutes although the time also depends on the intensity of the second infrared ray to be emitted.

A heat source different from the infrared ray may be used in combination at the time of heating the coating film 23a, which is similar to the case of the substrate drying method. Examples of another heat source are the same as those in the case of the substrate drying method, and thus, will not be described.

When the coating film 23a is heated such that the crosslinking group is crosslinked, the coating film 23a is heated by adjusting the distance between the infrared irradiation unit 62 and the coating film 23a, the heating time, the irradiation intensity of the infrared ray and the like, such that the temperature of the substrate 10 is equal to or lower than the glass transition temperature (Tg) of the plastic material constituting the substrate 10.

Here, the description has been given regarding the method for forming the organic functional layer as the organic thin film by using the infrared heating together with the coating liquid containing the material having the crosslinking group, giving as an example the case of forming the hole transport layer 23. However, this method can also be applied to the formation of organic thin films (for example, the hole injection layer 22, the light-emitting layer 24, and the electron injection layer 25) other than the hole transport layer 23.

For example, when the organic functional layer other than the hole transport layer 23 is formed using the coating liquid containing the material having the crosslinking group, a coating liquid containing a material (for example, a hole injection material and a light-emitting material, or the like) as a main component of the organic functional layer that needs to be formed and containing the material having the crosslinking group may be used.

Examples of the coating liquid containing the material having the crosslinking group include (1) a mode in which a crosslinking agent is further contained as a material having the crosslinking group and in which a material for developing a predetermined function of the organic functional layer itself does not have the crosslinking group; (2) a mode in which the material for developing the predetermined function of the organic functional layer itself has the crosslinking group; and (3) a mode in which the crosslinking agent is further included and in which the material for developing the predetermined function of the organic functional layer itself has the crosslinking group.

As described above, the hole injection layer 22 needs to be subjected to activation processing in the course of forming the hole injection layer 22. This activation processing method will be described. The hole injection material of the hole injection layer 22 formed by using the activation processing method is preferably a material having an electron-accepting property, and for example, is preferably a material containing a conventionally known organic material having a hole transport property and an electron-accepting material.

[Activation Processing Method in Formation of Hole Injection Layer]

Figure 9:
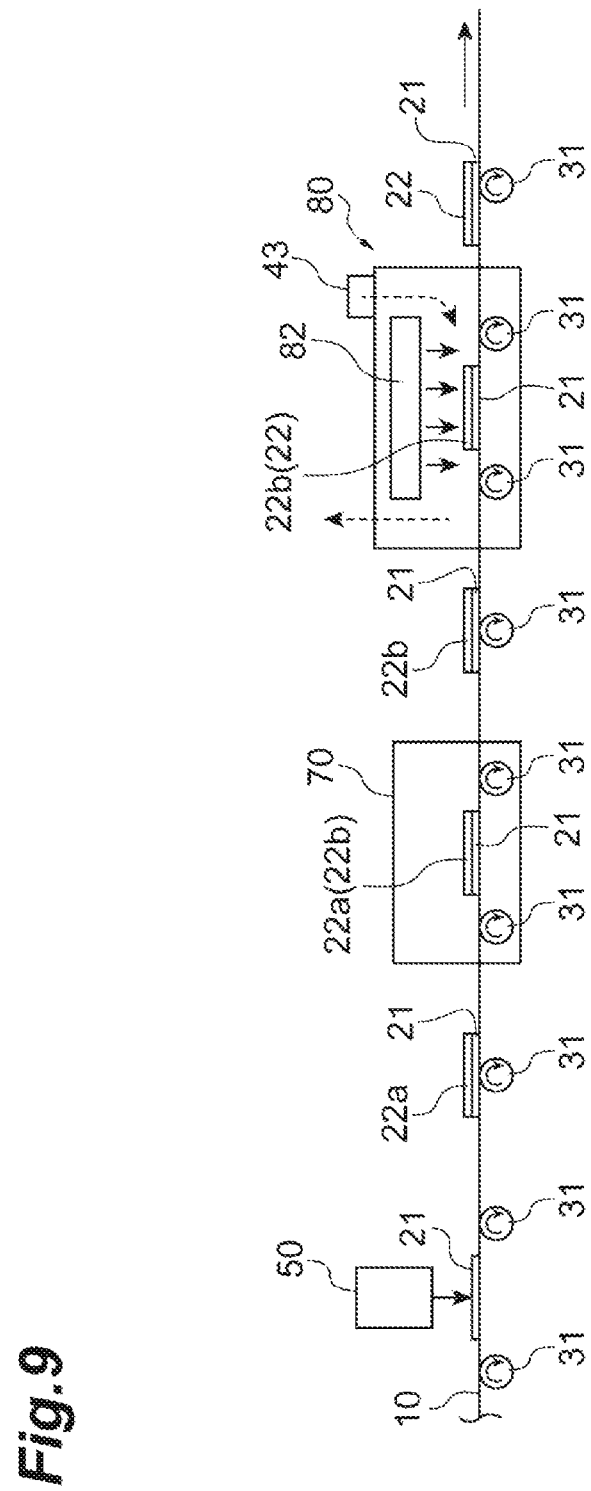
FIG. 9 is a schematic view illustrating an example of a hole injection layer formation step.

As illustrated in FIG. 9, a case where the hole injection layer 22 is formed by the roll-to-roll method will be described. In FIG. 9, a portion corresponding to the hole injection layer formation step is selected and schematically illustrates among the manufacturing steps of the organic EL element 1A by the roll-to-roll method conceptually illustrated in FIG. 3. A portion corresponding to the other steps is not illustrated.

In the method for manufacturing the organic EL element 1A illustrated in FIG. 3, the hole injection layer 22 is formed after forming the anode layer 21. Thus, FIG. 9 illustrates a state where the hole injection layer 22 is formed while conveying the anode layer 21 formed at the predetermined position of the elongated substrate 10. In FIG. 9, a layer configuration on the substrate 10 is illustrated in an enlarged manner for the convenience of description.

The coating device 50, a drying device 70, and the heat treatment device 80 schematically illustrated in FIG. 9 are used in a method for forming the hole injection layer 22 as the organic thin film.

The coating device 50 is the same as the device illustrated in FIG. 6 which has been described in the method for forming the hole transport layer 23. The coating device 50 used in the hole injection layer formation step S22 applies a coating liquid that forms the hole injection layer 22 onto the anode layer 21.

The drying device 70 is a device that dries a coating film 22a made of the coating liquid applied from the coating device 50. A layer obtained by drying the coating film 22a using the drying device 70 will be referred to as an inactive hole injection layer (a hole injection layer coating film) 22b. A known drying device can be used as the drying device 70, and examples of the drying device 70 include a drying device capable of performing hot air drying, reduced-pressure drying, drying using electromagnetic induction, infrared drying, and the like. Drying in the drying device 70 is performed under a temperature condition where the deformation of the substrate 10 does not occur, that is, the condition equal to or lower than the glass transition temperature of the substrate 10 which is the plastic substrate.

The heat treatment device 80 is a device that emits infrared rays to heat the inactive hole injection layer 22b. The hole injection layer 22 is obtained by activating the inactive hole injection layer 22b using the heat treatment device 80. The heat treatment device 80 is provided on the conveyance path of the substrate 10 such that the substrate 10 passes through the inside of the heat treatment device 80.

The heat treatment device 80 has an infrared irradiation unit 82 arranged in a heat treatment furnace 81 so as to face the main surface (the main surface on the side where the element body 20 is formed) of the substrate 10.

The infrared rays output by the infrared irradiation unit 82 will be referred to as a third infrared ray, and a radiation spectrum of the third infrared ray will be referred to as a radiation spectrum SP3. The third infrared ray includes infrared rays having a wavelength range of 1.2 μm to 10.0 μm. A shape of the radiation spectrum SP3 may be the same as or different from a shape of a radiation spectrum SP1 or SP2.

Conditions to be satisfied by the radiation spectrum SP3 are as follows. The radiation spectrum SP3 has a wavelength (maximum peak wavelength) corresponding to the maximum radiation intensity in the wavelength range 1.2 μm to 10.0 μm in the first wavelength range of 1.2 μm to 5.0 μm. The radiation spectrum RS3 has 80% or more radiation energy in the first wavelength range out of the total radiation energy in the wavelength range of 1.2 μm to 10.0 μm.

In one embodiment, an integral value of the radiation spectrum SP3 in the first wavelength range of 1.2 μm to 5.0 μm is larger than an integral value of the radiation spectrum SP3 in the second wavelength range of 5.0 μm to 10.0 μm in the radiation spectrum SP3.

In one embodiment, the third infrared ray may have a wavelength (maximum peak wavelength) in the first wavelength range of 1.2 μm to 5.0 μm, corresponding to the maximum radiation intensity in the wavelength range of 1.2 μm to 10.0 μm.

In the hole injection layer formation step S22, the above-described coating liquid containing the hole injection material (the hole injection layer coating liquid) is applied from the coating device 50 onto the anode layer 21 to form the coating film 22a. Thereafter, the coating film 22a is dried inside the drying device 70 to form the inactive hole injection layer 22b (a hole injection layer coating film formation step). Thereafter, the inactive hole injection layer 22b, which is the dried coating film 22a, is heated and activated to form the hole injection layer 22 (a heat treatment step).

Although a solvent of the coating liquid for forming the hole injection layer 22 is not particularly limited as long as the solvent dissolves the hole injection material, examples of the solvent include a chloride solvent such as chloroform, methylene chloride, and dichloroethane, an ether solvent such as tetrahydrofuran, an aromatic hydrocarbon solvent such as toluene and xylene, a ketone solvent such as acetone and methyl ethyl ketone, and an ester solvent such as ethyl acetate, butyl acetate, and ethyl cellosolve acetate.

The inactive hole injection layer 22b as the dried coating film 22a has absorption in the first wavelength range of 1.2 μm to 5.0 μm.

Figure 10:
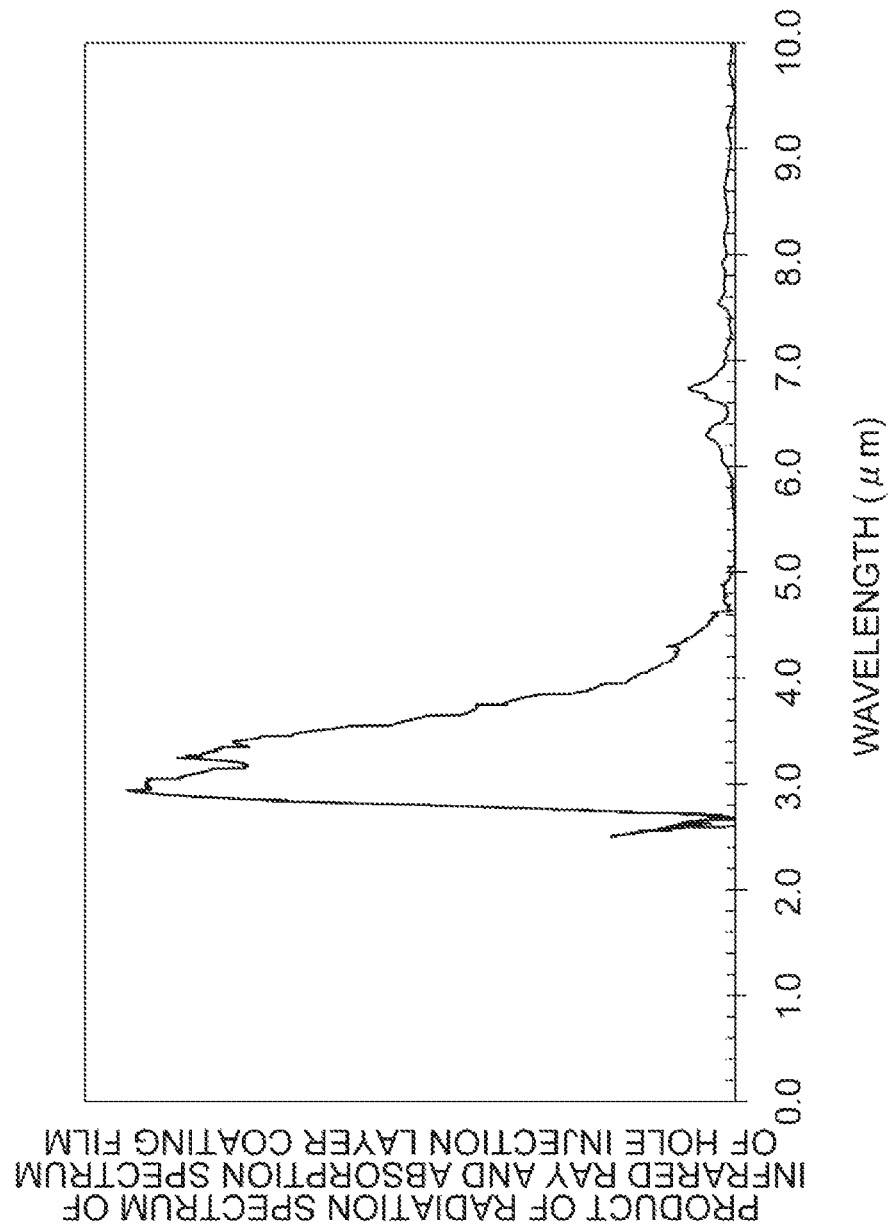
FIG. 10 is a view illustrating an example of a spectrum of a product of the radiation spectrum of the infrared ray and an absorption spectrum of a hole injection layer coating film.

In one embodiment, as the heating activation condition, when the integral value in the first wavelength range is A1 and the integral value in the second wavelength range is A2 in a spectrum (see FIG. 10) of a product of a radiation spectrum RS3 of the third infrared ray and an absorption spectrum AS3 of the inactive hole injection layer 22b, A1/(A1+A2) preferably satisfies 0.8 or more. FIG. 10 is an example of the spectrum of the product described above. In FIG. 10, the abscissa represents the wavelength (μm), and the ordinate represents the product of the radiation spectrum RS3 of the third infrared ray and the absorption spectrum of the inactive hole injection layer 22b. The unit of the ordinate represents an arbitrary unit.

In order to perform such heating, for example, the radiation spectrum SP3 of the third infrared ray emitted from the infrared irradiation unit 82 may be adjusted such that A1/(A1+A2) satisfies 0.8 or more.

An example of irradiation time of the third infrared ray to the inactive hole injection layer 22b is within 10 minutes although the time also depends on the intensity of the infrared ray to be emitted.

A heat source other than the infrared ray may also be used in combination at the time of heating the inactive hole injection layer 22b. Examples of another heat source are the same as those in the case of the substrate drying method, and thus, will not be described.

When the inactive hole injection layer 22b is heated to be activated, the inactive hole injection layer 22b is heated by adjusting the distance between the infrared irradiation unit 82 and the inactive hole injection layer 22b, the heating time, the irradiation intensity of the infrared ray and the like, such that the temperature of the substrate 10 is equal to or lower than the glass transition temperature (Tg) of the plastic material constituting the substrate 10.

In the method for manufacturing the organic EL element 1A described above, it is possible to reduce the moisture content of the substrate 10 (for example, 100 ppm or less) since the substrate drying step S10 of the substrate 10, which is the plastic substrate, is provided. The organic thin films which are the functional layers such as the hole injection layer 22, the hole transport layer 23, the light-emitting layer 24, and the electron injection layer 25 constituting the organic EL element 1A easily deteriorate by the influence of moisture. Thus, the product life of the organic EL element 1A can be improved by reducing the moisture content of the substrate 10.

In order to evaporate moisture in the substrate 10 under atmospheric pressure, it is necessary to heat the substrate 10 to 100° C. or higher. In the substrate drying step S10 illustrated in FIG. 4, the substrate 10 is heated by using the first infrared ray having the radiation spectrum RS1. The first infrared ray used in the substrate drying step S10 has infrared rays having the first wavelength range of 1.2 μm to 5.0 μm. On the other hand, water has a maximum absorption peak at a wavelength of 2.9 μm within the first wavelength range. Thus, the water in the substrate 10 can be directly heated by the first infrared ray.

The first infrared ray has the second wavelength range, and the plastic material which is the main component of the substrate 10 has absorption in the second wavelength range as schematically illustrated in FIG. 2. Thus, the moisture in the substrate 10 is indirectly heated by the heat transfer accompanying a rise in temperature of the substrate 10 caused by the absorption of the infrared ray in the second wavelength range of the plastic material.

In this manner, the moisture in the substrate 10 can be not only directly heated by the first infrared ray but also indirectly heated in the substrate drying method using the first infrared ray. Accordingly, it is possible to evaporate the moisture in a shorter time than in the related art, and thus, the time required for drying the substrate 10 is shortened. As a result, it is possible to suppress an excessive temperature rise in which the temperature of the substrate 10 becomes equal to or higher than the glass transition temperature, therefore, it is also possible to reduce damage on the substrate 10 and to obtain the improvement of productivity of the organic EL element 1A.

The plastic material which is the main component of the substrate 10 tends to have a characteristic that an integral value of the absorption spectrum AS1 in the first wavelength range is smaller than an integral value of the absorption spectrum AS1 in the second wavelength range. On the other hand, the integral value of the first wavelength range is larger than the integral value of the second wavelength range in the radiation spectrum RS1 of the first infrared ray. Therefore, even if the substrate 10 has the absorption in the second wavelength range, the first infrared ray has greater energy in the first wavelength range, therefore, it is possible to heat the moisture while suppressing the excessive temperature rise of the substrate 10. Thus, the damage of the substrate 10 such as deformation of the substrate 10 is less likely to occur.

It is possible to perform the substrate drying while suppressing the excessive rise in temperature of the substrate 10 caused by the absorption of the infrared ray and effectively heating and evaporating the moisture, in the mode of heating the substrate 10 under the condition of $B1/(B1+B2) \geq 0.2$ as described above, for example, in the mode of irradiating the substrate 10 with the first infrared ray having the radiation spectrum RS1 satisfying the above-described condition. Thus, it is possible to perform the substrate drying while suppressing the deformation of the substrate 10.

Further, it is possible to further shorten the dehydration time by using the heat source other than the first infrared ray and heating the substrate 10 with the heating source other than the first infrared ray. As a result, the productivity of the organic EL element 1A is easily improved.

It is effective for the roll-to-roll method that the substrate drying step S10 can be performed in a short time as described above. It is possible to efficiently perform the heat treatment on the substrate 10 in the roll-to-roll method, and thus, the productivity of the organic EL element 1A can be further improved.

In the above-described manufacturing method, the hole transport layer 23 is formed using the coating liquid containing the material having the crosslinking group and the infrared heating. The crosslinking reaction (including polymerization reaction) is caused by at least one of light and heat. Therefore, the coating film 23a having the maximum absorption peak p1 in the wavelength range of 1.2 μm to 10.0 μm in the first wavelength range is irradiated with the second infrared ray, having the maximum radiation intensity in the wavelength range of 1.2 μm to 10.0 μm in the first wavelength range, to crosslink the crosslinking group contained in the coating film 23a, whereby the insolubilized hole transport layer 23 can be formed. Thus, for example, even when the light-emitting layer 24 is formed on the hole transport layer 23 by the coating method, the hole transport layer 23 which is a lower layer is insolubilized with respect to the coating liquid so that it is possible to reduce the damage on the hole transport layer 23 which is the lower layer with respect to the light-emitting layer 24. This point will be specifically described hereinafter while being compared with a conventional method hereinafter.

In the manufacturing of the organic EL element 1A having the stacked structure illustrated in FIG. 1, it is necessary to stack a plurality of organic functional layers. It is possible to stack the plurality of organic functional layers without any problem in the case of forming each organic functional layer by, for example, a gas phase method, but it takes time to manufacture the organic EL element. On the other hand, if the coating method is used, the productivity of the organic EL element can be improved more as compared to the case of using the gas phase method. However, there is a problem that a layer (for example, the hole transport layer) previously formed dissolves in an ink solvent at the time of forming an upper layer (for example, the light-emitting layer) so that the upper layer and the lower layer are mixed.

It is possible to consider to insolubilize the lower layer as one of methods to avoid such a problem. As a method of insolubilization, a material contained in a coating liquid for forming a layer may be set as a crosslinking material containing a crosslinking group. It is also possible to consider heating with a hot plate as a heating method of the coating film for crosslinking the crosslinking group, but heating at high temperature (for example, 180° C.) for a long time (for example, 60 minutes) is necessary in order to cause the crosslinking reaction.

Since such high temperature is higher than the glass transition temperature (Tg) of the plastic material, which is the main component of the substrate, the substrate 10 is damaged. Alternatively, it is also possible to consider to cause the crosslinking reaction in a short time by using laser light with high intensity, but the damage on the substrate 10 occurs even in this case.

In regard to this, the coating film 23a that forms the hole transport layer 23 is heated by using the second infrared ray, which has the radiation spectrum SP2 having the maximum radiation intensity in the wavelength range of 1.2 μm to 10.0 μm at any wavelength in the first wavelength range of 1.2 μm to 5.0 μm, in the hole transport layer formation step S23.

Meanwhile, the coating film 23a has the maximum absorption peak p1 in the first wavelength range of 1.2 μm to 5.0 μm similar to the absorption spectrum AS2 illustrated in FIG. 7. Thus, most of the energy of the second infrared ray is absorbed by the coating film 23a, and the coating film 23a is directly heated by the second infrared ray. Since the substrate 10 tends to have greater absorption in the second wavelength range than in the first wavelength range, a temperature rise accompanying the absorption of the second infrared ray occurs in the substrate 10. The coating film 23a is indirectly heated by the heat transfer caused by the temperature rise of the substrate 10. In this manner, the coating film 23a is not only directly heated by irradiation of the second infrared ray but also indirectly heated. As a result, the crosslinking reaction proceeds faster, and the curing time of the coating film 23a is shortened. As a result, the excessive rise in temperature of the substrate 10 can be suppressed, and the damage on the substrate 10 is suppressed.

In this manner, it is possible to form the hole transport layer 23 by crosslinking the crosslinking group in a shorter time (for example, 10 minutes or less) while reducing the damage on the substrate 10 in the hole transport layer formation step S23. Since the hole transport layer 23 thus formed has been insolubilized, the hole transport layer 23 and the light-emitting layer 24 are not mixed, for example, even when the light-emitting layer 24 on the hole transport layer 23 is formed by the coating method.

Since the damage (deflection or the like) on the substrate 10 is reduced, the product life of the organic EL element 1A can be improved. Since the formation time of the hole transport layer 23 can be shortened, the productivity of the organic EL element 1A can be also improved. Further, since the hole transport layer 23 can be formed in a shorter time (for example, within 10 minutes), the method for forming the organic functional layer described in the hole transport layer formation step S23 is effective for the roll-to-roll method as it is unnecessary to secure a long conveying distance in order to secure the time required to complete the crosslinking reaction.

In particular, when the coating film 23a has the absorption peak p2 in the second wavelength range, the second infrared ray in the second wavelength range is absorbed so that the coating film 23a can be heated even in the second wavelength range. As a result, the heating efficiency of the coating film 23a is improved, and thus, the crosslinking of the crosslinking group is likely to occur, and as a result, the time for curing the coating film 23a can be shortened.

In this manner, even if the second infrared ray includes the second wavelength range, it is possible to reduce the damage on the substrate 10 if the radiation energy of the second infrared ray in the second wavelength range is smaller than the radiation energy in the first wavelength range as described above.

When the second infrared ray is in a form that 80% or more of the total radiation energy in the wavelength range of 1.2 μm to 10.0 μm is in the first wavelength range, it is possible to reduce the influence of the second infrared ray on the substrate 10 while heating the coating film 23a with the second infrared ray.

When C1 is larger than C2 as described above in the mode in which the coating film 23a has the absorption peak p2 in the second wavelength range, it is possible to heat the coating film 23a by the infrared ray in the second wavelength range while mainly heating the coating film 23a by the infrared ray in the first wavelength range. Accordingly, the heating efficiency of the coating film 23a is improved, and the coating film 23a can be cured in a shorter time. As a result, the excessive rise in temperature of the substrate is further suppressed, and the influence of the infrared ray on the substrate 10 can be reduced. In the mode of heating the coating film 23a under the condition that C1/(C1+C2) satisfies 0.6 or more as described above, it is possible to increase the proportion of the effect of direct heating of the coating film 23a using the second infrared ray with respect to the effect of heating caused by the temperature rise of the substrate 10 due to the absorption of the infrared ray and the heat transfer accompanying the temperature rise. Thus, the crosslinking processing can be performed in a shorter time than in the related art (for example, the case of using a hot plate) while suppressing the damage such as thermal deformation caused by the excessive temperature rise of the substrate 10.

If another heat source (hot air or the like) is used together with the infrared irradiation at the time of heating the coating film 23a in the hole transport layer formation step S23, the coating film 23a is further heated by heat from the other heat source, and thus, the crosslinking group is more easily crosslinked, and as a result, the time required for the hole transport layer formation step S23 can be shortened.

Here, the description has been given by exemplifying the case where the hole transport layer 23 is heated by using the coating liquid containing the material having the crosslinking group and by irradiation with the second infrared ray. However, the same method can be applied to the case of forming another organic functional layer and the same operational effect is obtained.

In the above-described method for manufacturing the organic EL element 1A, the third infrared ray is used to perform the heat processing (or the activation processing) on the inactive hole injection layer 22b as the coating film 22a, which has been subjected to the dry processing, in the activation process in the process of forming the hole injection layer 22. Accordingly, the hole injection layer 22 can be formed in a short time while reducing the damage on the substrate 10. This point will be described in comparison with the case where the activation processing is performed by using a hot plate.

In the activation processing, it is necessary to heat the coating film up to 180° C. when the coating film that forms the hole injection layer 22 is heated by using the hot plate. When the substrate is the plastic substrate, such a heating method corresponds to heating to temperature at an approximately equal to or higher than the glass transition temperature of a constituent material of the substrate. In this case, damage occurs, such as deformation caused by the temperature of the substrate.

In regard to this, the third infrared ray having the radiation spectrum RS3 is used to heat the inactive hole injection layer 22b, which is the hole injection layer coating film, in the hole injection layer formation step S22 illustrated in FIG. 9.

The third infrared ray used in the hole injection layer formation step S22 is an infrared ray having 80% or more radiation energy in the first wavelength range out of the total radiation energy in the wavelength range of 1.2 μm to 10.0 μm. The inactive hole injection layer 22b has absorption in the first wavelength range. Thus, the third infrared ray is efficiently absorbed by the inactive hole injection layer 22b so that the inactive hole injection layer 22b is directly heated. Since the substrate 10 tends to have greater absorption in the second wavelength range than in the first wavelength range, a temperature rise accompanying the absorption of the third infrared ray occurs in the substrate 10. The inactive hole injection layer 22b is indirectly heated by the heat transfer caused by the temperature rise of the substrate 10. In this manner, the inactive hole injection layer 22b is not only directly heated by irradiation of the third infrared ray but also indirectly heated. As a result, the time required for the activation processing of the inactive hole injection layer 22b is shortened.

In this manner, since it is possible to shorten the time for heating and activating the inactive hole injection layer 22b, it is possible to activate the inactive hole injection layer 22b to form the hole injection layer 22 while suppressing the excessive rise in temperature of the substrate 10. Accordingly, it is possible to form the hole injection layer 22 in a shorter time while suppressing the deformation (for example, damage) or the like of the substrate 10, and it is possible to improve the productivity of the organic EL element 1A. As described above, the substrate 10 has the absorption in the second wavelength range, but since the third infrared ray has small energy in the second wavelength range, even so, it is possible to suppress the excessive temperature rise of the substrate 10.

In one embodiment, when A1 is larger than A2 as described above, the inactive hole injection layer 22b can be more efficiently heated by the third infrared ray in the first wavelength range, and thus, it is possible to develop the electron-accepting function in the inactive hole injection layer 22b in a short time. As a result, the excessive rise in temperature of the substrate 10 is further suppressed, and the influence of the third infrared ray on the substrate 10 can be reduced. In addition, in the mode of heating the inactive hole injection layer 22b under the condition that A1/(A1+A2) satisfies 0.8 or more as described above, the proportion of the effect of direct heating of the inactive hole injection layer 22b using the third infrared ray becomes large with respect to the effect of heating caused by the temperature rise of the substrate 10 due to the absorption of the infrared ray and the heat transfer accompanying the temperature rise. Thus, the activation processing can be performed in a shorter time than in the related art (for example, the case of using a hot plate) while suppressing the damage such as thermal deformation caused by the excessive temperature rise of the substrate 10.

If another heat source (hot air or the like) is used together with the infrared irradiation at the time of heating the inactive hole injection layer 22b, the inactive hole injection layer 22b is further heated by heat from the other heat source, and thus, the heating efficiency of the inactive hole injection layer 22b is further improved, and as a result, the time required for the hole injection layer formation step S22 can be shortened.

As described above, it is possible to reduce the damage on the substrate 10 in the substrate drying step S10, the activation processing in the hole injection layer formation step S22, and the hole transport layer formation step S23 in the method for manufacturing the organic EL element 1A illustrated in FIG. 3. Thus, the product life of the manufactured organic EL element 1A is improved. Further, it is possible to perform the drying processing of the substrate 10, the activation processing, and the curing processing of the coating film 23a that forms the hole transport layer 23 in a short time. Accordingly, it is possible to improve the manufacturing efficiency of the organic EL element 1A.

In the description regarding the operational effects of the manufacturing method of the organic EL element 1A, the operational effects of the method for forming the organic functional layer (organic thin film) by using the coating liquid having the material containing the crosslinking group and using the heating by the infrared ray have been described regarding the case of forming the hole transport layer 23.

Meanwhile, at the time of forming the light-emitting layer 24 and the electron injection layer 25, it is possible to form the organic functional layer that needs to be formed in a short time while reducing the damage on the substrate 10 even in the case of using the method for forming the organic functional layer described in the hole transport layer formation step S23. Accordingly, it is possible to improve the product life of the organic EL element 1A. When forming the hole injection layer 22, the inactive hole injection layer 22b may be formed by using the method for forming the organic functional layer described in the hole transport layer formation step S23. In this case, an infrared irradiation condition at the time of forming the inactive hole injection layer 22b and an infrared irradiation condition for the subsequent activation processing may be adjusted to those corresponding to each processing.

Next, a description will be further given regarding the drying method of the substrate 10 in the substrate drying step S10, the method for forming the organic thin film in the hole transport layer formation step S23, and the activation processing in the hole injection layer formation step S22 with reference to experimental results.

Experiment on Substrate Drying

Experiment 1 and Experiment 2

Experiments 1 and 2 will be described. Experiment 2 is a comparative experiment relative to Experiment 1.

Experiment 1

In Experiment 1, a PEN (polyethylene naphthalate) film (grade: Q65HA) F1, manufactured by Teijin DuPont, having a film thickness of 125 μm was prepared.

The prepared PEN film F1 was set in the heat treatment device equipped with the infrared irradiation unit. The distance between the PEN film F1 and the infrared irradiation unit was 160 mm. In atmosphere in which the oxygen concentration was controlled to be 100 ppm or less by a volume ratio and the dew-point temperature was controlled to −40° C. or lower, the PEN film F1 was irradiated with the first infrared ray from the infrared irradiation unit to perform drying processing for 5 minutes while supplying hot air having temperature of 71° C. and a flow rate of 4.2 m³/h in order to set film surface temperature at 150° C. An infrared heater was used as a light source of the infrared irradiation unit.

The integral value of the first wavelength range of 1.2 μm to 5.0 μm in the radiation spectrum RS 1 of the first infrared ray used in drying was 176.5 kW/(m²·μm), and the integral value of the second wavelength range of 5.0 μm to 10.0 μm was 5.18 kW/(m² μm). Assuming the integral value in the wavelength range of 1.2 μm to 10 μm as 100, the integral value of the first wavelength range was 97.1 and the integral value of the second wavelength range was 2.9. A spectrum of a product of the radiation spectrum RS1 of the first infrared ray and an absorption spectrum of the PEN film F1 used in Experiment 1 was the same as illustrated in FIG. 5. In the spectrum of the product illustrated in FIG. 5, a value of B1 as the integral value of the first wavelength range of 1.2 μm to 5.0 μm, a value of B2 as the integral value of the second wavelength range of 5.0 μm to 10.0 μm were 0.046 and 0.175, respectively, and a value of B1/(B1+B2) was 0.21.

The PEN film F1 treated in the heat treatment device 40 was sealed so as not to be exposed to the atmosphere, the residual moisture concentration of the PEN film was measured by applying the Karl Fischer method (KF method), and a degree of dehydration was evaluated. For the measurement of the residual moisture concentration by the KF method, a Karl Fischer moisture meter (Model 831) manufactured by Metrohm AG was used. During the measurement of the residual moisture concentration by the KF method, the PEN film was divided into two pieces to measure the residual moisture concentration.

Experiment 2

In Experiment 2 for comparison, a PEN film (hereinafter referred to as a PEN film F2), which is the same as that of Experiment 1, was subjected to heat treatment in a vacuum device at 150° C. for 5 hours. The residual moisture concentration of the PEN film F2 thus dried in this manner was evaluated by the KF method in the same manner as in the case of Experiment 1.

Experimental results of Experiments 1 and 2 are shown in Table 1.

TABLE 1

| | Result of KF method |
|---|---|
| Experiment 1 | 40 to 60 ppm |
| Experiment 2 | 130 to 300 ppm |

As understood from Table 1, the moisture concentration was high as 130 ppm to 300 ppm in the result of the KF measurement in Experiment 2. On the other hand, the moisture concentration of 40 ppm to 60 ppm was realized in the KF measurement by the treatment for 5 minutes in Experiment 1 in which the first infrared ray was used.

That is, it is understood that the moisture can be efficiently removed in a short time by irradiating the PEN film F1 with the first infrared ray having the radiation spectrum RS 1. Further, the heating at high temperature of 150° C. is unnecessary, and thus, it is possible to suppress the deformation of the plastic substrate even when the substrate is the plastic substrate.

[Experiment on Formation of Organic Functional Layer Using Material Containing Crosslinking Group]

Hereinafter, a case where a layer containing a macromolecular compound 1 is formed as a hole transport layer will be described. A synthesis method of the macromolecular compound 1 is as follows.

<Synthesis of Macromolecular Compound 1>

(Step 1) After setting the inside of a reaction vessel under nitrogen gas atmosphere, a monomer CM1 (3.74 g) synthesized according to the method described in Japanese Unexamined Patent Application Publication No. 2010-189630, a monomer CM2 (5.81 g) synthesized according to the method described in PCT International Application Publication No. 2005/049546, a monomer CM3 (0.594 g) synthesized according to the method described in Japanese Unexamined Patent Application Publication No. 2008-106241, and toluene (182 ml) were added to the reaction vessel and heated to about 80° C. Thereafter, dichlorobis(tris(2-methoxyphenyl)phosphine)palladium (6.62 mg) and 20 wt % tetraethylammonium hydroxide aqueous solution (26.0 g) were added thereto, and the mixture was stirred under reflux for about 7.5 hours.

[Chemical Formula 5]

Monomer CM1

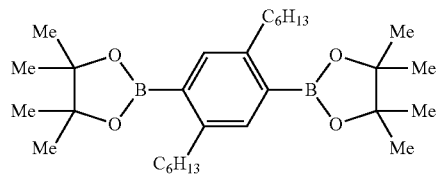

Monomer CM2

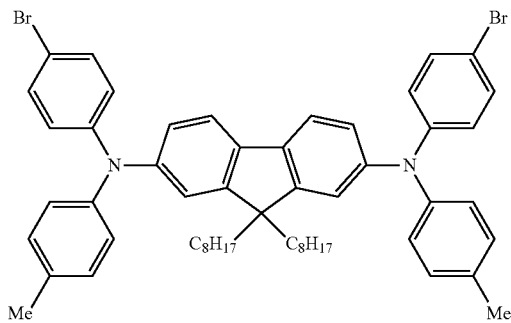

Monomer CM3

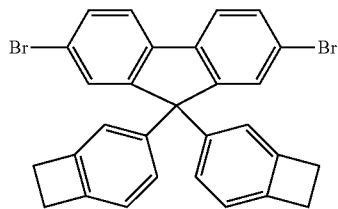

(Step 2) Thereafter, phenylboronic acid (91.4 mg), dichlorobis(tris(2-methoxyphenyl)phosphine)palladium (6.62 mg), and 20 wt % tetraethylammonium hydroxide aqueous solution (26.0 g) were added thereto, and the mixture was further stirred under reflux for about 15 hours.

(Step 3) Thereafter, a solution prepared by dissolving sodium N, N-diethyldithiocarbamate trihydrate (4.17 g) in ion-exchanged water (84 ml) was added thereto, and the mixture was stirred for 2 hours while heating at 85° C. The obtained reaction solution was cooled and then washed twice with ion-exchanged water, twice with a 3.0 wt % acetic acid aqueous solution, and twice with ion-exchanged water. When the obtained solution was dropped into methanol, precipitation occurred. The obtained precipitate was dissolved in toluene and purified by causing the resultant to pass through an alumina column and a silica gel column in this order. When the obtained solution was dropped into methanol and stirred, precipitation occurred. The obtained precipitate was collected by filtration and dried to obtain the macromolecular compound 1 (6.34 g). The polystyrene-equivalent number average molecular weight (Mn) of the macromolecular compound 1 was $5.5\times10^4$, and the polystyrene-equivalent weight average molecular weight (Mw) was $1.4\times10^5$.

Based on a theoretical value obtained from the amount of a charged raw material, the macromolecular compound 1 is a copolymer in which a constitutional unit derived from the monomer CM1, a constituent unit derived from the monomer CM2, and a constitutional unit derived from the monomer CM3 are constituted at a molar ratio of 50:42.5:7.5.

Experiment 3

In Experiment 3, a xylene solution, in which the macromolecular compound 1 was dissolved in xylene, was prepared. The concentration of the macromolecular compound 1 in this xylene solution was 0.5 wt %. Next, a glass substrate was coated with the obtained xylene solution by a spin coating method in the air atmosphere to form the coating film for the hole transport layer having a thickness of 20 nm.

The glass substrate with the coating film thus formed was set inside the heat treatment device provided with the infrared irradiation unit. The distance between the glass substrate with the coating film and the infrared irradiation unit was 160 mm. In atmosphere in which the oxygen concentration was controlled to be 100 ppm or less by a volume ratio and the dew-point temperature was controlled to −40° C. or lower, the glass substrate was irradiated with the second infrared ray from the infrared irradiation unit from the coating film side to perform heat treatment for 10 minutes while supplying hot air having temperature of 71° C. and a flow rate of 4.2 m³/h in order to set surface temperature of the glass substrate at 150° C., thereby obtaining the hole transport layer. The infrared irradiation unit uses an infrared heater.

The integral value of the first wavelength range of 1.2 μm to 5.0 μm of the second infrared ray used in the heat treatment was 176.5 kW/(m²·μm), and the integral value of the second wavelength range of 5.0 μm to 10.0 μm was 5.18 kW/(m²·μm). Assuming the integral value in the wavelength range of 1.2 μm to 10 μm as 100, the integral value of the first wavelength range was 97.1 and the integral value of the second wavelength range was 2.9. A spectrum of a product of a radiation spectrum of the second infrared ray and an absorption spectrum of the coating film was as illustrated in FIG. 7. In FIG. 7, values of the integral value C1 in the first wavelength range of 1.2 μm to 5.0 μm and the integral value C2 in the second wavelength range of 5.0 μm to 10.0 μm were 0.093 and 0.058, respectively, and a value of C1/(C1+C2) was 0.618.

The thickness of the hole transport layer after the heat treatment was measured with a stylus-type film thickness meter P16 manufactured by Tencor Corporation. Thereafter, a surface on the hole transport layer side of the glass substrate with the hole transport layer was rinsed (washed) with the xylene solvent using a spin coating method to remove non-crosslinked (soluble) components. Next, the thickness of the hole transport layer after rinsing was again measured with the stylus-type film thickness meter P16 manufactured by Tencor Corporation, and a crosslinking rate was calculated by the following equation.

Crosslinking rate (%)={(thickness of hole transport layer after rinsing)/(thickness of hole transport layer before rinsing)}×100

Figure 11:
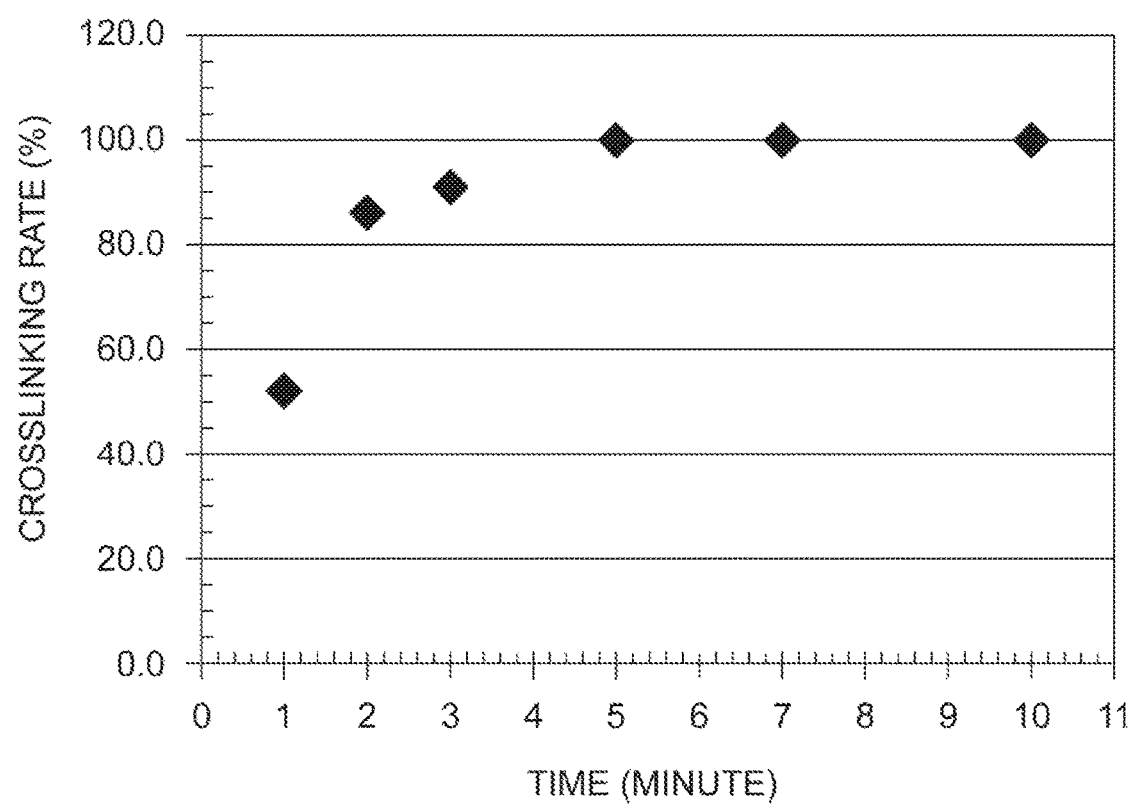
FIG. 11 is a graph illustrating a change of a crosslinking rate with respect to infrared irradiation time.

The above-described Experiment 3 was carried out for each case where the heat treatment time was changed to 1 minute, 2 minutes, 5 minutes, or 7 minutes. Experimental results are as illustrated in FIG. 11. As illustrated in FIG. 11, the coating film can be substantially cured if heated for 5 minutes or more and for about 10 minutes at the latest. That is, the hole transport layer can be formed in a shorter time by using the second infrared ray.

Experiment 4 and Experiment 5

Next, Experiment 4 and Experiment 5 will be described. Experiment 5 is a comparative experiment with respect to Experiment 4.

Experiment 4

In Experiment 4, an organic EL element having the following configuration was produced. The organic EL element prepared in Experiment 4 will be referred to as an organic EL element 2a.

"Glass substrate/ITO layer (thickness 50 nm)/layer containing a hole injection material 1 (thickness 35 nm)/layer containing the macromolecular compound 1 (thickness 20 nm)/layer containing a macromolecular compound 2 (thickness 75 nm)/NaF layer (thickness 4 nm)/Al layer (thickness 100 nm)"

Here, the layer containing the hole injection material 1 which is the macromolecular compound corresponds to the hole injection layer, the layer containing the macromolecular compound 1 corresponds to the hole transport layer, and the layer containing the macromolecular compound 2 corresponds to the light-emitting layer. The macromolecular compound 2 was prepared as follows. That is, the macromolecular compound 2 was prepared by mixing a light-emitting organic metal complex synthesized according to the method described in PCT International Application Publication No. 2009-131255, as a dopant, with a host material.

First, the glass substrate with the ITO film (anode layer) having the thickness of 50 nm formed by a sputtering method was coated with a suspension of the hole injection material 1 by a spin coating method to obtain a coating film having the thickness of 35 nm. The glass substrate provided with this coating film was heated at 170° C. for 15 minutes on a hot plate in air atmosphere at atmospheric pressure to evaporate a solvent. Thereafter, the glass substrate was naturally cooled to room temperature to obtain a glass substrate on which the hole injection layer containing the hole injection material 1 was formed. The hole injection layer was formed in the air atmosphere.

Next, a xylene solution L, in which the macromolecular compound 1 obtained by the above-described synthesis example was dissolved in xylene, was prepared. The concentration of the macromolecular compound 1 in the xylene solution L was 0.5 wt %. Next, the glass substrate was coated with the obtained xylene solution L by a spin coating method in the air atmosphere to form the coating film for the hole transport layer having a thickness of 20 nm.

Subsequently, the glass substrate was set in the heat treatment device equipped with the infrared irradiation unit. The distance between the glass substrate and the infrared irradiation unit was 160 mm. In nitrogen gas atmosphere in which the oxygen concentration was controlled to be 100 ppm or less by a volume ratio and the dew-point temperature was controlled to −40° C. or lower, the glass substrate was heated with the second infrared ray from the infrared irradiation unit for 10 minutes while supplying hot air having temperature of 71° C. and a flow rate of 4.2 m³/h in order to set surface temperature of the glass substrate at 150° C., thereby obtaining the hole transport layer. The condition of the radiation spectrum of the second infrared ray, that is, the integral values of the first wavelength range and the second wavelength range were the same as those in the case of Experiment 3.

Next, a xylene solution, in which the macromolecular compound 2 as the light-emitting material was dissolved in xylene, was prepared. The concentration of the macromolecular compound 2 in this xylene solution was 1.3 wt %. The glass substrate was coated with the obtained xylene solution by a spin coating method in air atmosphere to form a coating film for the light-emitting layer having a thickness of 75 nm. Further, the coating film was held and dried at 130° C. for 10 minutes in the nitrogen gas atmosphere in which each of the oxygen concentration and the moisture concentration was controlled to be 10 ppm or less by volume ratio, thereby obtaining the light-emitting layer.

Next, sodium fluoride (NaF) was vapor-deposited under vacuum as the cathode layer to have a thickness of about 4 nm, and aluminum (Al) was vapor-deposited to have a thickness of about 100 nm to be stacked. After forming the cathode layer, sealing was performed using a glass substrate which is a sealing substrate, thereby producing the organic EL element 2a.

The external quantum efficiency of the produced organic EL element 2a was measured. As a result, a maximum value of the external quantum efficiency was 19.4%.

In Experiment 4, a residual film ratio was measured in the following manner. That is, the same xylene solution L as that in the case of preparing the organic EL element 2a was prepared. Next, the glass substrate was coated with the xylene solution L by a spin coating method in the air atmosphere to obtain the coating film of the macromolecular compound 1. Under the same conditions as those in the case of preparing the organic EL element 2a, the obtained coating film was heated by the heat treatment device 60, and then, the heated coating film was coated with the xylene solvent by a spin coating, the heated coating film was rinsed, the thickness of the remaining coating film was measured using a stylus-type film thickness meter P16 manufactured by Tencor Corporation, and a measured value was defined as t1.

In addition, the same xylene solution L was prepared as that in the case of preparing the organic EL element 2a. Next, the glass substrate was coated with the xylene solution L by a spin coating method in the air atmosphere to obtain the coating film of the macromolecular compound 1. The thickness of the obtained coating film not subjected to the heat treatment was measured using the stylus-type film thickness meter P16 manufactured by Tencor Corporation, and a measured value was defined as a film thickness t2. Using the obtained film thicknesses t1 and t2, the residual film ratio was obtained by the equation: Residual film ratio=(t1/t2).

Experiment 5

In Experiment 5, an organic EL element was formed in the same manner as Experiment 4 except a point of using a hot plate instead of the heat treatment device using the second infrared ray when forming the layer containing the macromolecular compound 1. The organic EL element of Experiment 5 will be referred to as an organic EL element 2b. Specifically, the glass substrate was coated with the xylene solution L prepared in Experiment 4 by a spin coating method to form the coating film for the hole transport layer having the thickness of 20 nm. In the nitrogen gas atmosphere in which the oxygen concentration was controlled to 100 ppm or less by a volume ratio and the dew-point temperature was controlled to −40° C. or less, the obtained coating film was held at 180° C. for 60 minutes using a hot plate to form a solidified thin film, thereby obtaining the hole transport layer.

The external quantum efficiency of the prepared organic EL element 2b was measured in the same manner as in Experiment 4. As a result, a maximum value of the external quantum efficiency was 19.4%.

In Experiment 5, the residual film ratio was also measured as follows. First, the glass substrate was coated with the above-described xylene solution L by a spin coating method in the air atmosphere to obtain the coating film of the macromolecular compound 1. Under the same conditions as those in the case of preparing the organic EL element 2b, the obtained coating film was heated by the hot plate, and then, the heated coating film was coated with the xylene solvent by a spin coating, the heated coating film was rinsed, the thickness of the remaining coating film was measured using a stylus-type film thickness meter P16 manufactured by Tencor Corporation, and a measured value was defined as t3.

Further, the film remaining rate was obtained by the equation: Residual film ratio=(t3/t2) by using the film thickness t2 used in Experiment 4 and the above-described t3.

Experimental results of Experiment 4 and Experiment 5 described above are shown in the following Table 2.

TABLE 2

|  | External quantum efficiency (%) | Residual film ratio (%) |
| --- | --- | --- |
| Experiment 4 | 19.4 | 95% |
| Experiment 5 | 19.4 | 97% |

As apparent from Table 2, it is understood that the hole transport layer and the organic EL element capable of achieving at least substantially the same degree of element life and external quantum efficiency, as compared to those of the conventional heat treatment using the hot plate, can be manufactured in an extremely short time according to the method for forming the organic functional layer by heating the coating film containing the crosslinking group with the second infrared ray. Further, the heating at high temperature of 180° C. is unnecessary, and thus, it is possible to suppress the deformation of the plastic substrate even when the substrate is the plastic substrate.

In Experiment 4, the residual film ratio equivalent to Experiment 5 was achieved. Accordingly, it has been suggested that it is possible to effectively suppress the dissolution of the organic functional layer which is the lower layer caused by the solvent for forming the upper layer even if another functional layer is formed as the upper layer by the coating method, in the method for forming the organic functional layer by heating the coating film containing the crosslinking group with the second infrared ray.

Experiment on Activation Processing of Hole Injection Layer

Experiment 6

In Experiment 6, an organic EL element having the same configuration as that of Experiment 4 was produced except a point that a hole injection layer, made of a hole injection material 2 in which an organic material having a hole transport property is combined with an electron-accepting material, is formed instead of the hole injection layer as the layer containing the hole injection material 1, a point that a macromolecular compound 3 was used instead of the macromolecular compound 1 as the hole transport material, and a point that a macromolecular compound 4 was used instead of the macromolecular compound 2 as the light-emitting material. The organic EL element produced in Experiment 6 will be referred to as organic EL element 2c. A method for producing the organic EL element 2c is the same as that of Experiment 4 except a point that a method for forming the hole injection layer is different, a point that a method for forming the hole transport layer is different, and a point that a method for forming the light-emitting layer is different. Each method for forming the hole injection layer, the hole transport layer, and the light-emitting layer in Experiment 6 will be described.

(Method for Forming Hole Injection Layer)

A glass substrate with an ITO film (anode layer) having a thickness of 50 nm formed by a sputtering method was coated with a suspension of the macromolecular compound P2 by a spin coating method to obtain a coating film having a thickness of 35 nm. The glass substrate provided with the coating film was held and dried at 130° C. for 5 minutes using a hot plate (drying device), and then, subjected to heat-treatment with the heat treatment device equipped with the infrared irradiation unit to form the hole injection layer.

In the heat treatment device, the glass substrate with the hole injection layer coating film dried by the hot plate was heated as follows. The glass substrate with the hole injection layer coating film was set in the heat treatment device. The distance between the glass substrate and the infrared irradiation unit was 160 mm. In atmosphere in which the oxygen concentration was controlled to be 100 ppm or less by a volume ratio and the dew-point temperature was controlled to −40° C. or lower, the hole injection layer coating film was subjected to the heat treatment (activation processing) with the third infrared ray from the infrared irradiation unit for 10 minutes while supplying hot air having temperature of 71° C. and a flow rate of 4.2 m³/h in order to set surface temperature of the glass substrate at 150° C.

A condition of the third infrared ray from the infrared irradiation unit was the same as the conditions of the first and second infrared rays. A spectrum of a product of the radiation spectrum RS3 of the third infrared ray and an absorption spectrum of the hole injection layer coating film was as illustrated in FIG. 10. In FIG. 10, values of the integral value A1 in the first wavelength range of 1.2 µm to 5.0 µm and the integral value A2 in the second wavelength range of 5.0 µm to 10.0 µm were 0.538 and 0.037, respectively, and a value of A1/(A1+A2) was 0.953.

(Method for Forming Hole Transport Layer)

A xylene solution, in which the macromolecular compound 3 was dissolved in xylene, was prepared. The concentration of the macromolecular compound 3 in this xylene solution was 0.5 wt %. Next, a glass substrate was coated with the obtained xylene solution by a spin coating method in the air atmosphere to form the coating film for the hole transport layer having a thickness of 20 nm.

Subsequently, the glass substrate was set in the heat treatment device equipped with the infrared irradiation unit. The distance between the glass substrate and the infrared irradiation unit was 160 mm. In nitrogen gas atmosphere in which the oxygen concentration was controlled to be 100 ppm or less by a volume ratio and the dew-point temperature was controlled to −40° C. or lower, the glass substrate was heated with the second infrared ray from the infrared irradiation unit for 10 minutes while supplying hot air having temperature of 71° C. and a flow rate of 4.2 m³/h in order to set surface temperature of the glass substrate at 150° C., thereby obtaining the hole transport layer. The condition of the radiation spectrum of the second infrared ray, that is, the integral values of the first wavelength range and the second wavelength range were the same as those in the case of Experiment 3.

(Method for Forming Light Emitting Layer)

Next, a xylene solution, in which the macromolecular compound 4 as the light-emitting material was dissolved in xylene, was prepared. The concentration of the macromolecular compound 4 in this xylene solution was 1.3 wt %. The glass substrate was coated with the obtained xylene solution by a spin coating method in air atmosphere to form a coating film for the light-emitting layer having a thickness of 75 nm. Further, the coating film was held and dried at 130° C. for 10 minutes in the nitrogen gas atmosphere in which each of the oxygen concentration and the moisture concentration was controlled to be 10 ppm or less by volume ratio, thereby obtaining the light-emitting layer.

The external quantum efficiency of the produced organic EL element 2c was measured. As a result, a maximum value of external quantum efficiency was 16.5%. A drive voltage was 6.3 V at 10 mA/cm². The element life of the organic EL element 2c was measured. The element life was evaluated by LT80 that is represented by the time until luminance drops to 80 from start of driving when the luminance at the start of driving is defined as 100. The measurement of element life was started by measuring the organic EL element 2c at initial luminance of 3000 cd/m² under driving with a constant current. As a result, the element life was 155 hours.

Experiment 7

In Experiment 7, an organic EL element was produced in the same manner as in Experiment 6 except a point of using the heating with a hot plate instead of the heating with the heat treatment device in Experiment 6. The organic EL element in Experiment 7 will be referred to as an organic EL element 2d. A heating condition with the hot plate was 15 minutes at 230° C. The element life and external quantum efficiency were measured for the prepared organic EL element 2d in the same manner as in Experiment 6. As a result, a maximum value of the external quantum efficiency was 16.5%, and a drive voltage was 6.2 V at 10 mA/cm². The element life was 160 hours.

Experiment 8

In Experiment 8, an organic EL element was produced in the same manner as in Experiment 6 except a point that the heat treatment time was set to 15 minutes instead of the heat treatment time of 10 minutes at the time of forming the hole injection layer in Experiment 6.

The external quantum efficiency of the produced organic EL element was measured. As a result, a maximum value of the external quantum efficiency was 16.2%. In addition, a drive voltage was 6.3 V at 10 mA/cm². In addition, the element life of the organic EL element was measured. The element life was evaluated by LT80 that is represented by the time until luminance drops to 80 from start of driving when the luminance at the start of driving is defined as 100. The measurement of element life was started by measuring the organic EL element at initial luminance of 3000 cd/m² under driving with a constant current. As a result, the element life was 155 hours.

Measurement results of Experiment 6, Experiment 7 and Experiment 8 are shown in Table 3.

TABLE 3

| | Element life | External quantum efficiency (%) | Drive voltage (V) |
| --- | --- | --- | --- |
| Experiment 6 | 155 hours | 16.5 | 6.3 |
| Experiment 7 | 160 hours | 16.5 | 6.2 |
| Experiment 8 | 155 hours | 16.2 | 6.3 |

When comparing Experiment 6, Experiment 7, and Experiment 8, it is understood that it is possible to realize substantially the same performance as the case of using the hot plate at temperature of 230° C. for 15 minutes, by utilizing the heat activation processing using the third infrared ray. Further, since the heat treatment time can be shortened in the case of using the third infrared ray, it is possible to improve the productivity of the organic EL element by using the third infrared ray. Further, the heating at high temperature of 230° C. is unnecessary, and thus, it is possible to suppress the deformation of the plastic substrate even when the substrate is the plastic substrate.

As compared with Experiment 7, it is possible to obtain the operational effect that makes it possible to obtain substantially the same light emission characteristic even with lower processing temperature and shorter processing time in Experiment 6 and Experiment 8 regardless of kinds of the hole transport material and the light-emitting layer material. Therefore, it is possible to confirm the same operational effect even if the macromolecular compound 3 is replaced with the macromolecular compound 1. In addition, it is possible to confirm the same operational effect even if the macromolecular compound 4 is replaced with the macromolecular compound 2.

Next, an evaluation experiment on deformation of the plastic substrate caused by heat will be described with reference to FIGS. 14(a) and 14(b).

Evaluation Experiment 1

Figure 14A:
FIGS. 14(a) and 14(b) are views for describing an evaluation method in an evaluation experiment of deformation of a substrate caused by heat, (a) illustrates a test piece before heat treatment, and (b) illustrates the test piece after heat treatment.
Figure 14B:
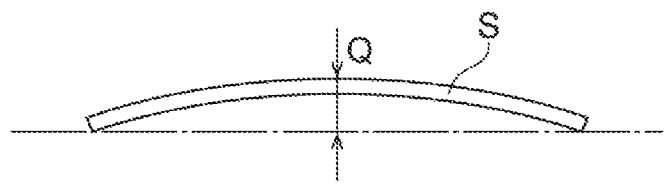

For Evaluation Experiment 1, a test piece S (see FIG. 14(a)) was prepared by cutting a PEN (polyethylene naphthalate) film (grade: Q65HA) manufactured by Teijin DuPont having a film thickness of 125 µm. A size of the test piece S was 10 mm×10 mm.

The prepared test piece S was set in the heat treatment device provided with the infrared irradiation unit. The distance between the test piece S and the infrared irradiation unit was 160 mm. In atmosphere in which the oxygen concentration is controlled to be 100 ppm or less by a volume ratio and the dew-point temperature is controlled to be equal to or lower than −40° C., the test piece S was irradiated with the third infrared ray from the infrared irradiation unit to perform drying processing for a predetermined time P (minutes) while supplying hot air having temperature of 71° C. and a flow rate of 4.2 m$^3$/h in order to set surface temperature of the test piece S at 150° C. An infrared heater was used as a light source of the infrared irradiation unit. The condition of the radiation spectrum of the third infrared ray, that is, the integral values of the first wavelength range and the second wavelength range were the same as those in the case of Experiment 6.

A distance Q (mm) between a maximum deformed portion and a bottom portion of the test piece S, subjected to the drying processing as described above, was measured using a gauge. As illustrated in FIG. 14(b), the distance Q between the maximum deformed portion and the bottom portion of the test piece S was a maximum distance between a virtual plane including both ends of the heated test piece S (a plane indicated by the one-dot chain line in FIG. 14(b)), and a surface on the opposite side of the virtual plane of the test piece S. The above-described virtual plane corresponds to a flat surface when the heated test piece S is placed on the flat surface. Warp deformation defined by the following expression was used for evaluation of warp deformation.

Speed of warp deformation=$Q/P$ (mm/min)

Comparative Evaluation Example I-1

The test piece S was subjected to heat treatment in the same manner as in the case of Experiment 7 using a hot plate. Specifically, the test piece S was subjected to heat treatment at temperature of 230° C. for 15 minutes using the hot plate. That is, P=15 in Comparative Evaluation Example 1. The test piece S was deformed so as to include a lot of wrinkles instead of being deformed to curve with a single curve as illustrated in FIG. 14(b). Thus, it was impossible to measure the distance Q between the maximum deformed portion and the bottom portion of the test piece S, therefore, it was impossible to calculate the speed of warp deformation.

Evaluation Example I-1

The hole injection layer coating film in Experiment 6 was assumed, and the test piece S was irradiated for 10 minutes with the third infrared ray having the same value of A1/(A1+A2) of 0.953 as that of Experiment 6. The distance between the maximum deformed portion and the bottom portion of the test piece S was 2 mm. That is, P=10 and Q=2 in Evaluation Example I-1. As a result, the speed of warp deformation was 0.2 mm/min. In Evaluation Example 1, almost no wrinkles such as those of Comparative Evaluation Example I-1 occurred.

As apparent from Evaluation Example I-1, it is possible to suppress the warp deformation of the plastic substrate according to the method of the present invention. Further, it is possible to suppress the wrinkles such as those occurred in the test piece S of Comparative Evaluation Example I-1. Accordingly, it is possible to suppress the deformation of the plastic substrate according to the method of the present invention as apparent from Comparative Evaluation Example I-1 and Evaluation Example I-1.

Evaluation Experiment II

In Evaluation Experiment II, the same test piece S as that of Evaluation Experiment I was prepared, and the test piece S was subjected to drying processing in the same manner as in Evaluation Experiment I except a point that the test piece S was irradiated with the above-described first infrared ray instead of the third infrared ray. A distance Q (mm) between the maximum deformed portion and the bottom portion of the dried test piece S was measured using a gauge, and the speed of warp deformation was calculated in the same manner as in Evaluation Experiment I.

Evaluation Example II-1

The test piece S was irradiated for 10 minutes with the first infrared ray, which is the same as that of Experiment 1 and in which a value of B1/(B1+B2) was 0.21. The distance between the maximum deformed portion and the bottom portion of the test piece S was 2 mm. That is, P=10 and Q=2 in Evaluation Example II-1. As a result, the speed of warp deformation was 0.2 mm/min.

Evaluation Example II-2

The test piece S was irradiated for 30 minutes with the first infrared ray in which a value of B1/(B1+B2) was 0.33. The first infrared ray used in this evaluation example is an infrared ray in which 98% of the total radiation energy of the infrared ray in the wavelength range of 1.2 µm to 10.0 µm is included in the first wavelength range. The distance between the maximum deformed portion and the bottom portion of the test piece S was 1 mm. That is, P=30 and Q=1 in Evaluation Example II-2. As a result, the speed of warp deformation was 0.033 mm/min.

Evaluation Example II-3

The test piece S was irradiated for 125 minutes with the first infrared ray in which a value of B1/(B1+B2) was 0.88. The first infrared ray used in this evaluation example is an infrared ray in which 99% of the total radiation energy of the infrared ray in the wavelength range of 1.2 µm to 10.0 µm is included in the first wavelength range. The distance between the maximum deformed portion and the bottom portion of the test piece S was 0.5 mm. That is, P=125 and Q=0.5 in Evaluation Example II-3. As a result, the speed of warp deformation was 0.004 mm/min.

Evaluation Example II-4

The test piece S was irradiated for 5 minutes with the first infrared ray in which a value of B1/(B1+B2) was 0.145. The first infrared ray used in this evaluation example is an infrared ray in which 95% of the total radiation energy of the infrared ray in the wavelength range of 1.2 µm to 10.0 µm is included in the first wavelength range. The distance between the maximum deformed portion and the bottom portion of the test piece S was 3 mm. That is, P=5 and Q=3 in Evaluation Example II-4. As a result, the speed of warp deformation was 0.6 mm/min.

As apparent from Evaluation Examples II-1 to II-4, it is possible to suppress the deformation of the plastic substrate in the substrate drying method using the first infrared ray described in the first embodiment. In addition, when the value of B1/(B1+B2) is 0.2 or more, the deformation of the plastic substrate can be remarkably suppressed.

Evaluation Experiment III

In Evaluation Experiment III, the same test piece S as that of Evaluation Experiment I was prepared, and the test piece S was subjected to drying processing in the same manner as in Evaluation Experiment I except a point that the test piece S was irradiated with the above-described second infrared ray instead of the third infrared ray. A distance Q (mm) between the maximum deformed portion and the bottom portion of the dried test piece S was measured using a gauge, and the speed of warp deformation was calculated in the same manner as in Evaluation Experiment 1.

Comparative Evaluation Example III-1

The test piece S was subjected to heat treatment in the same manner as in Experiment 5 using a hot plate. Specifically, the test piece S was subjected to heat treatment with heat at temperature of 180° C. for 60 minutes using the hot plate. That is, P=60 in Comparative Evaluation Example III-1. The test piece S of Comparative Evaluation Example III-1 was not deformed to bend with a single curve as illustrated in FIG. 14(b) but was deformed to have a large number of wrinkles. Thus, it is impossible to measure a distance Q between a maximum deformed portion and a bottom portion S, and thus, the speed of warp deformation could not be calculated.

Evaluation Example III-1

The coating film for the hole transport layer in Experiment 4 was assumed, and the test piece S was irradiated for 10 minutes with the second infrared ray having the same value of C1/(C1+C2) of 0.618 as that of Experiment 4. The distance between the maximum deformed portion and the bottom portion of the test piece S was 2 mm. That is, P=10 and Q=2 in Evaluation Example III-1. As a result, the speed of warp deformation was 0.2 mm/min. In Evaluation Example III-1, almost no wrinkles such as those of Comparative Evaluation Example III-1 occurred.

Evaluation Example III-2

The coating film for the hole transport layer in Experiment 4 was assumed, and the test piece S was irradiated for 5 minutes with the second infrared ray having a value of C1/(C1+C2) of 0.51. The second infrared ray used in this evaluation example is an infrared ray in which 95% of the total radiation energy of the infrared ray in the wavelength range of 1.2 µm to 10.0 µm is included in the first wavelength range. The distance between the maximum deformed portion and the bottom portion of the test piece S was 3 mm.

That is, P=5 and Q=3 in Evaluation Example III-2. As a result, the speed of warp deformation was 0.6 mm/min. In Evaluation Example III-2, almost no wrinkles such as those of Comparative Evaluation Example III-1 occurred.

Based on results of Evaluation Examples III-1 and III-2, it is possible to suppress the warp deformation of the plastic substrate if a coating film for forming an organic thin film is dried with the second infrared ray as described by exemplifying the method for forming the hole transport layer 23. Further, it is possible to suppress the wrinkles such as those occurred in the test piece S of Comparative Evaluation Example III-1. Accordingly, it is possible to suppress the deformation of the plastic substrate by drying the coating film for the organic thin film using the second infrared ray as described in the first embodiment. In addition, when the value of C1/(C1+C2) is 0.6 or more, the deformation of the plastic substrate can be remarkably suppressed.

As above, the method for manufacturing the organic EL element 1A has been described as the first embodiment. In the above description, the case of including the anode layer 21, the hole injection layer 22, the hole transport layer 23, the light-emitting layer 24, the electron injection layer 25, and the cathode layer 26 has been exemplified, as illustrated in FIG. 1, as the configuration of the element body 20 provided in the organic EL element 1A. However, the configuration of the organic EL element 1A is not limited to the configuration illustrated in FIG. 1 as long as including the hole injection layer 22.

An example of a layer configuration provided between the anode layer 21 and the cathode layer 26 in the element body 20 will be described. A redundant description will not be described in some cases regarding the hole injection layer, the hole transport layer, the light-emitting layer, and the electron injection layer.

Examples of the layer provided between the cathode layer and the light-emitting layer include an electron injection layer, an electron transport layer, a hole-blocking layer, and the like. When both the electron injection layer and the electron transport layer are provided between the cathode layer and the light-emitting layer, a layer in contact with the cathode layer is referred to as the electron injection layer, and a layer obtained by excluding this electron injection layer is referred to as the electron transport layer.

The electron injection layer has a function of improving the electron injection efficiency from the cathode layer. The electron transport layer has a function of receiving electrons from the electron injection layer or the cathode layer when the electron injection layer is not provided and transporting electrons to the light-emitting layer.

The hole-blocking layer is a layer having a function of blocking transport of holes. When at least one of the electron injection layer and the electron transport layer has the function of blocking the transport of holes, these layers may also serve as the hole-blocking layer. For example, an organic EL element that allows only a hole current to flow is produced, and the effect of blocking a current value thereof can be confirmed.

Examples of the layer provided between the anode layer and the light-emitting layer include a hole injection layer, a hole transport layer, an electron block layer, and the like. A layer in contact with the anode layer is referred to as the hole injection layer.

The hole injection layer has a function of improving the hole injection efficiency from the anode. The hole transport layer has a function of receiving holes from the hole injection layer (or the anode layer when the hole injection layer is not provided) and transporting the holes to the light-emitting layer.

The electron-blocking layer has a function of blocking the transport of electrons. When at least one of the hole injection layer and the hole transport layer has the function of blocking the transport of electrons, these layers may also serve as the electrons blocking layer. For example, an organic EL element that allows only an electron current to flow is produced, and the effect of blocking the transport of electrons can be confirmed based on a decrease of a measured current value.

An example of a layer configuration that can be provided the organic EL element will be described hereinafter as a modified example of the organic EL element 1A. The following is an example of the layer configuration of the element body 20 formed on the substrate 10.

(a) Anode layer/hole injection layer/light-emitting layer/cathode layer (b) Anode layer/hole injection layer/light emitting layer/electron injection layer/cathode layer (c) Anode layer/hole injection layer/light emitting layer/electron transport layer/electron injection layer/cathode layer (d) Anode layer/hole injection layer/hole transport layer/light emitting layer/cathode layer (e) Anode layer/hole injection layer/hole transport layer/light emitting layer/electron injection layer/cathode layer (f) Anode layer/hole injection layer/hole transport layer/light emitting layer/electron transport layer/electron injection layer/cathode layer A symbol "/" means that layers on both sides of the symbol "/" are bonded to each other.

The layer configuration of (e) described above is the configuration illustrated in FIG. 1. In the above-described configurations other than (e), the anode layer, the hole injection layer, the hole transport layer, the light-emitting layer, the electron injection layer, and the cathode layer correspond to the respective layers included in the element body 20 illustrated in FIG. 1, that is, the anode layer 21, the hole injection layer 22, the hole transport layer 23, the light-emitting layer 24, the electron injection layer 25, and the cathode layer 26, have the same configurations as the respective layers included in the element body 20, and can be formed by the same formation method.

In a mode in which both the electron injection layer and the electron transport layer are provided between the cathode layer and the light-emitting layer as in the configuration of (f), a layer in contact with the cathode layer is referred to as the electron injection layer, and a layer obtained by excluding this electron injection layer is referred to as the electron transport layer.

The electron transport layer has a function of improving electron injection from the cathode layer, the electron injection layer, or the electron transport layer closer to the cathode layer. A known material can be used as an electron transport material constituting the electron transport layer. Examples of the electron transport material constituting the electron transport layer include an oxadiazole derivative, anthraquinodimethane or a derivative thereof, benzoquinone or a derivative thereof, naphthoquinone or a derivative thereof, anthraquinone or a derivative thereof, tetracyanoanthraquinodimethane or a derivative thereof, a fluorenone derivative, diphenyldicyanoethylene or a derivative thereof, a diphenoquinone derivative, a metal complex of 8-hydroxyquinoline or a derivative thereof, polyquinoline or a derivative thereof, polyquinoxaline or a derivative thereof, polyfluorene or a derivative thereof, and the like.

Among them, the electron transport material is preferably the oxadiazole derivative, the benzoquinone or the derivative thereof, the anthraquinone or the derivative thereof, the metal complex of 8-hydroxyquinoline or the derivative thereof, the polyquinoline or the derivative thereof, the polyquinoxaline or the derivative thereof, or a polyfluorene or the derivative thereof, and more preferably 2-(4-biphenylyl)-5-(4-tert-butylphenyl)-1,3,4-oxadiazole, benzoquinone, anthraquinone, tris(8-quinolinol)aluminum, or polyquinoline.

The thickness of the electron transport layer has different optimum values depending on a material to be used, and is appropriately determined in consideration of characteristics to be required, the simplicity of film formation, and the like. The thickness of the electron transport layer is, for example, 1 nm to 1 µm, preferably 2 nm to 500 nm, and more preferably 5 nm to 200 nm.

Further, the organic EL element 1A may include a single light-emitting layer or two or more light-emitting layers. When a stacked body arranged between the anode layer and the cathode layer is defined as a "structural unit A" in any one of the layer configurations of (a) to (f) described above, it is possible to exemplify a layer configuration illustrated in the following (g) as a configuration of an organic EL element having two light-emitting layers. The layer configuration of two units (structural units A) may be the same as or different from each other.

(g) Anode/(structural unit A)/charge generation layer/(structural unit A)/cathode Here, a charge generation layer is a layer that generates holes and electrons by applying an electric field. Examples of the charge generation layer may include a thin film made of vanadium oxide, indium tin oxide (abbreviated as ITO), molybdenum oxide, or the like.

When "(structural unit A)/charge generation layer" is defined as a "structural unit B", a layer structure illustrated in the following (h) can be exemplified as a configuration of an organic EL element having three or more light-emitting layers.

(h) Anode/(structural unit B)x/(structural unit A)/cathode

A symbol "x" represents an integer of two or more, and "((structural unit B)x" represents a stacked body in which (structural unit B) is stacked in x stages. The layer configuration of a plurality of units (structural units B) may be the same as or different from each other.

An organic EL element may be constituted by directly stacking a plurality of light-emitting layers without providing the charge generation layer.

In the above description, the example where the anode layer is arranged on the substrate side has been described, but the cathode layer may be arranged on the substrate side. In this case, the respective layers may be stacked on the substrate in the order from the cathode layer (the right side of each of the configurations (a) to (f)), for example, when each of the organic EL elements of (a) to (f) is produced on a substrate.

Second Embodiment

Figure 12:
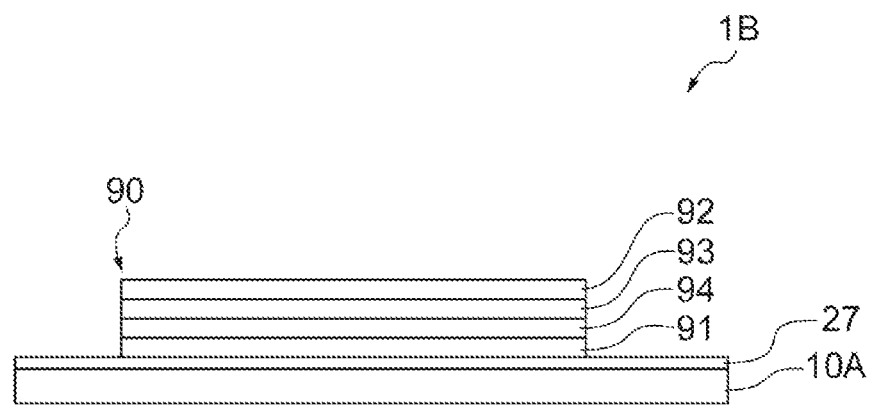
FIG. 12 is a view schematically illustrating an example of a configuration of an organic photoelectric conversion element which is an embodiment of the organic electronic element according to the present invention.

As schematically illustrated in FIG. 12, an organic photoelectric conversion element 1B as an organic electronic element according to a second embodiment includes a substrate 10A and an element body 90 provided on the substrate 10A. It is possible to use the same substrate as the substrate 10, which can be used for the organic EL element 1A illustrated in FIG. 1, as the substrate 10A. In one embodiment, the barrier layer 27 may be formed on the substrate 10A similarly to the case of the substrate 10.

The element body 90 includes an anode layer 91 and a cathode layer 92 which are a pair of electrodes, an active layer 93, and a hole injection layer 94. At least one of the anode layer 91 and the cathode layer 92 is constituted using a transparent or translucent electrode material. Examples of the transparent or translucent electrode material include a conductive metal oxide film, a translucent metal thin film, and the like. Examples of the transparent or translucent electrode material specifically include a film prepared using a conductive material such as indium oxide, zinc oxide, tin oxide, ITO, IZO, and NESA, and a film made of gold, platinum, silver, copper, or the like. Among these, the film made of ITO, IZO, or tin oxide is preferable.

When any one of the anode layer 91 and the cathode layer 92 is the transparent or translucent electrode, the other may be an opaque electrode.

It is possible to use metal, a conductive polymer or the like as a material of the opaque electrode. Examples of the material of the opaque electrode include metals such as lithium, sodium, potassium, rubidium, cesium, magnesium, calcium, strontium, barium, aluminum, scandium, vanadium, zinc, yttrium, indium, cerium, samarium, europium, terbium, and ytterbium, an ally of two or more of these metals, an alloy of one or more kinds of these metals and one or more kinds of metals selected from the group consisting of gold, silver, platinum, copper, manganese, titanium, cobalt, nickel, tungsten and tin, graphite, a graphite intercalation compound, polyaniline and a derivative thereof, and polythiophene and a derivative thereof.

Examples of the alloys include a magnesium-silver alloy, a magnesium-indium alloy, a magnesium-aluminum alloy, an indium-silver alloy, a lithium-aluminum alloy, a lithium-magnesium alloy, a lithium-indium alloy, a calcium-aluminum alloy, and the like.

Examples of a method for producing the anode layer 91 and the cathode layer 92 include a vacuum deposition method, a sputtering method, an ion plating method, a plating method, and the like. An organic transparent conductive film such as polyaniline and a derivative thereof and polythiophene and a derivative thereof may be used as the electrode material. The transparent or translucent electrode may be the anode layer 91 or the cathode layer 92.

The active layer 93 included in the organic photoelectric conversion element 1B is a bulk heterojunction type active layer or a double hetero type active layer.

In the case of the bulk heterojunction type, the active layer 93 contains an electron-donating compound and an electron-accepting compound. When the active layer is the double heterojunction type, a layer containing the electron-donating compound and a layer containing the electron-accepting compound are bonded.

The electron-donating compound is not particularly limited. Examples of the electron-donating compound include a pyrazoline derivative, an arylamine derivative, a stilbene derivative, a triphenyldiamine derivative, oligothiophene and a derivative thereof, polyvinylcarbazole and a derivative thereof, polysilane and a derivative thereof, a polysiloxane derivative having aromatic amine in a side chain or a main chain, polyaniline and a derivative thereof, polythiophene and a derivative thereof, a macromolecular compound containing thiophene as a partial skeleton, polypyrrole and a derivative thereof, polyphenylenevinylene and a derivative thereof, and polythienylenevinylene and a derivative thereof.

A compound having a benzothiadiazole structure, a macromolecular compound having a benzothiadiazole structure in a repeating unit, a compound having a quinoxaline structure, a macromolecular compound having a quinoxaline structure in a repeating unit, titanium oxide, carbon nanotube, fullerene, a fullerene derivative are preferable as the electron-accepting compound.

The active layer 93 may contain a component other than the above-described components in order to develop various functions. Examples of the component other than the above-described components include an ultraviolet absorber, an antioxidant, a sensitizer for sensitizing a function of generating electric charges by absorbed light, and a light stabilizer for increasing stability to ultraviolet rays.

The active layer 93 may contain a macromolecular compound other than the electron-donating compound and the electron-accepting compound as a macromolecular binder in order to enhance mechanical characteristics. A binder which does not excessively inhibit the electron transporting property or the hole transport property and a binder having low absorption to visible light are preferably used as the macromolecular binder.

Examples of the macromolecular binder include poly(N-vinylcarbazole), polyaniline and a derivative thereof, polythiophene and a derivative thereof, poly(p-phenylenevinylene) and a derivative thereof, poly(2,5-thienylenevinylene) and a derivative thereof, polycarbonate, polyacrylate, polymethyl acrylate, polymethyl methacrylate, polystyrene, polyvinyl chloride, polysiloxane, and the like.

For example, in the case of the bulk heterojunction type, the active layer 93 having the above-described configuration can be formed by performing film deposition using a solution containing the electron-donating compound, the electron-accepting compound, and other components to be blended if necessary. For example, the active layer 93 can be formed by applying this solution on the anode layer 91 or the cathode layer 92.

A solvent used for film deposition using the solution may be any solvent as long as the solvent dissolves the electron-donating compound and the electron-accepting compound described above, and a plurality of solvents may be mixed. Examples of the solvent include an unsaturated hydrocarbon solvent such as toluene, xylene, mesitylene, tetralin, decalin, bicyclohexyl, n-butylbenzene, sec-butylbenzene and tert-butylbenzene, a halogenated saturated hydrocarbon solvent such as carbon tetrachloride, chloroform, dichloromethane, dichloroethane, dichloropropane, chlorobutane, bromobutane, chloropentane, bromopentane, chlorohexane, bromohexane, chlorocyclohexane, and bromocyclohexane, a halogenated unsaturated hydrocarbon solvent such as chlorobenzene, dichlorobenzene, and trichlorobenzene, an ether solvent such as tetrahydrofuran and tetrahydropyran, and the like. For example, the material constituting the active layer 93 can be dissolved in the above-described solvent in the amount of 0.1 wt % or more.

The hole injection layer 94 is provided between the anode layer 91 and the active layer 93. In one embodiment, the hole injection layer 94 is provided so as to be in contact with the anode layer 91 and the active layer 93. A material of the hole injection layer 94 is a combination of a conventionally-known organic material having a hole transport property and an electron-accepting material in an organic photoelectric conversion element. In the case of forming the hole injection layer 94 made of such a material, activation processing (heat treatment) to develop an electron-accepting function is necessary.

The above-described organic photoelectric conversion element 1B is manufactured by forming the element body 90 on the substrate 10A after drying the substrate 10A in the same manner as the method described in the first embodiment. The anode layer 91, the cathode layer 92, and the active layer 93 in the element body 90 can be formed by a known method. In one embodiment, the active layer 93 can be formed by the method for forming the organic functional layer using the infrared heating together with the coating liquid containing the material having the crosslinking group (including the polymerizable group) described in the first embodiment.

The hole injection layer 94 is formed by the same formation method as the hole injection layer 22 in the first embodiment. That is, a coating liquid for the hole injection layer 94 is formed on the anode layer 91 and dried, thereby forming an inactive hole injection layer which is a hole injection layer coating film. This inactive hole injection layer is activated by applying the same activation processing as in the case of heating and activating the inactive hole injection layer 22b described in the first embodiment. In this case, the same operational effects as those in the case of describing the heating activation of the inactive hole injection layer 22b in the first embodiment are obtained.

Since a drying method of the substrate 10A is the same as the drying method of the substrate 10 in the first embodiment, the same operational effects as those in the first embodiment are obtained in the drying method of the substrate 10A in the method for manufacturing the organic photoelectric conversion element 1B. For formation of the active layer 93, it is possible to apply the method for forming the organic functional layer using the infrared ray together with the coating liquid having the crosslinking group as described in the first embodiment. In this case, the operational effects described with respect to the method for forming the organic functional layer using the infrared ray together with the coating liquid having the crosslinking group in the first embodiment, for example, are obtained. For example, the active layer 93 can be formed in a shorter time without damaging the substrate 10A. For example, when the active layer 93 has a double heterostructure, that is, a two-layer structure, a lower layer is formed by applying the method for forming the organic functional layer using the coating liquid having the crosslinking group described in the first embodiment, and thus, the lower layer is hardly affected even if an upper layer is formed by a coating method.

The organic photoelectric conversion element 1B may include an additional intermediate layer (a buffer layer, a charge transport layer, and the like) other than the active layer 93 in order to improve the photoelectric conversion efficiency in addition to the substrate 10A, the electrodes (the anode layer 91 and the cathode layer 92) and the active layer 93 described above. Such an intermediate layer can be provided, for example, between the anode layer 91 and the active layer 93, or between the cathode layer 92 and the active layer 93.

Examples of a material used for the intermediate layer include halides or oxides of alkali metal or alkaline earth metal such as lithium fluoride. An inorganic semiconductor fine particle such as titanium oxide, a mixture (PEDOT: PSS) of PEDOT (poly(3,4-ethylenedioxythiophene)) and PSS (poly(4-styrene sulfonate)) and the like may be used as the material of the intermediate layer.

An organic functional layer as the above-described intermediate layer can be formed by applying the method for forming the organic functional layer using infrared heating together with the coating liquid containing the material having the crosslinking group described in the first embodiment, for example. By utilizing this formation method, the intermediate layer is hardly affected even if an upper layer of the intermediate layer is formed by a coating method.

Third Embodiment

A case where an organic electronic element is an organic thin film transistor will be described as a third embodiment.

Examples of the organic thin film transistor include a transistor configured to include a source electrode and a drain electrode, an organic semiconductor layer which serves as a current path between these electrodes and contains a macromolecular compound which is an organic semiconductor, and a gate electrode to control the amount of current passing through the current path. Examples of the organic thin film transistor having such a configuration include a field effect type organic thin film transistor, an electrostatic induction type organic thin film transistor, and the like.

The field effect type organic thin film transistor generally includes a source electrode and a drain electrode, an organic semiconductor layer serving as a current path between these electrodes, a gate electrode to control the amount of current passing through the current path, and an insulating layer arranged between the organic semiconductor layer and the gate electrode.

The electrostatic induction type organic thin film transistor generally includes a source electrode and a drain electrode, an organic semiconductor layer serving as a current path between the electrodes, and a gate electrode to control the amount of current passing through the current path, and the gate electrode is provided inside the organic semiconductor layer.

It is enough that the gate electrode has a structure in which it is possible to form the current path flowing from the source electrode to the drain electrode and to control the amount of current flowing through the current path by a voltage applied to the gate electrode, and examples of the mode thereof include a comb-shaped electrode.

The organic thin film transistor according to the third embodiment further includes a hole injection layer in the configuration described above. A description will be specifically given by using an example of a field effect type organic thin film transistor 1C schematically illustrated in FIG. 13. The organic thin film transistor 1C includes a substrate 10B and an element body 100 provided on the substrate 10B. The substrate 10B may be the same substrate as the substrate 10 described in the first embodiment. In one embodiment, the barrier layer 27 may be formed on the substrate 10B similarly to the case of the first embodiment.

The element body 100 includes a gate electrode 101, an insulating layer 102, an organic semiconductor layer (organic functional layer) 103, a source electrode 104, and a drain electrode 105, and a hole injection layer 106.

The gate electrode 101 is provided on the substrate 10B. As the gate electrode 101, materials such as metal such as gold, platinum, silver, copper, chromium, palladium, aluminum, indium, molybdenum, low-resistance polysilicon, and low-resistance amorphous silicon, tin oxide, indium oxide, and ITO can be used. One kind of these materials may be used alone, or two or more kinds thereof may be used in combination. A silicon substrate doped with impurities at high concentration may be used as the gate electrode 101.

The insulating layer 102 is provided on the substrate 10B so as to bury the gate electrode 101. A material of the insulating layer 102 may be any material having high electrical insulation. As the material of the insulating layer 102, for example, $SiO_X$, $SiN_X$, $Ta_2O_5$, polyimide, polyvinyl alcohol, polyvinyl phenol, organic glass, photoresist, or the like can be used. It is preferable to use a material having a high dielectric constant as the material of the insulating layer 102 since it is possible to lower an operating voltage.

The organic semiconductor layer 103 is provided on the insulating layer 102. The organic semiconductor layer 103 is made of a material having p-type conductivity. A π-conjugated polymer can be used as an organic semiconductor which is a material of the organic semiconductor layer 103. For example, polypyrrole and a derivative thereof, polythiophene and a derivative thereof, polyaniline and a derivative thereof, polyallylamine and a derivative thereof, polyfluorene and a derivative thereof, polycarbazole and a derivative thereof, polyindole and a derivative thereof, poly(p-phenylene vinylene) and a derivative thereof can be used as the organic semiconductor which is the material of the organic semiconductor layer 103. A low molecular weight substance which is soluble in an organic solvent, for example, a polycyclic aromatic derivative such as pentacene, a phthalocyanine derivative, a perylene derivative, a tetrathiafulvalene derivative, and a tetracyanoquinodimethane derivative can be also used as the organic semiconductor which is the material of the organic semiconductor layer 103. Specific examples thereof include a condensate of 2,1,3-benzothiadiazole-4,7-di(ethylene boronate) and 2,6-dibromo-(4,4-bis-hexadecanyl-4H-cyclopenta[2,1-b;3,4-b']-dithiophene, a condensate of 9,9-di-n-octylfluorene-2,7-di(ethylene boronate) and 5,5'-dibromo-2,2'-biithiophene, and the like.

The source electrode 104 and the drain electrode 105 are provided on the organic semiconductor layer 103 to be spaced apart from each other. The organic semiconductor layer 103 positioned between the source electrode 104 and the drain electrode 105 corresponds to a channel portion as the current path. The source electrode 104 and the drain electrode 105 are preferably made of a low-resistance material, and particularly preferably made of gold, platinum, silver, copper, chromium, palladium, aluminum, indium, molybdenum, or the like. One kind of these materials may be used alone, or two or more kinds thereof may be used in combination.

The hole injection layer 106 is provided between the source electrode 104 and the drain electrode 105, and the organic semiconductor layer 103. A material of the hole injection layer 106 is a combination of a conventionally-known organic material having a hole transport property and an electron-accepting material in an organic thin film transistor. In the case of forming the hole injection layer 106 made of such a material, activation processing (heat treatment) to develop an electron-accepting function is necessary.

The above-described organic thin film transistor 1C can be manufactured by forming the element body 100 after drying the substrate 10B by the substrate drying method described in the first embodiment. In the element body 100, constituent elements other than the hole injection layer 106 can be formed by a known method and can be produced by a method described in, for example, Japanese Unexamined Patent Application Publication No. H5-110069.

In one embodiment, when the insulating layer 102 is made of an organic material, the insulating layer 102 can be formed, for example, by the method for forming the organic functional layer using the infrared heating together with the coating liquid containing the material having the crosslinking group described in the first embodiment. Similarly, the organic semiconductor layer 103 can be also formed by the method for forming the organic functional layer using the infrared heating together with the coating liquid containing the material having the crosslinking group described in the first embodiment. The gate electrode 101, the source electrode 104, and the drain electrode 105 can be formed by a known method such as a vapor deposition method, a sputtering method, an inkjet method, and the like.

In the element body 100, the hole injection layer 106 can be formed by the same formation method as the hole injection layer 22 in the first embodiment. That is, a coating liquid for the hole injection layer 106 is formed on the organic semiconductor layer 103 and dried, thereby forming an inactive hole injection layer which is a hole injection layer coating film. This inactive hole injection layer is activated by applying the same activation processing as in the case of heating and activating the inactive hole injection layer 22b described in the first embodiment.

Since the substrate 10B is dried in the same manner as the substrate drying method described in the first embodiment, the same operational effects as those of the first embodiment are also obtained regarding the drying of the substrate 10B by the method for manufacturing the organic thin film transistor 1C. When the insulating layer 102 and the organic semiconductor layer 103 are formed by the above-described method for forming the organic functional layer described in the first embodiment, the same operational effects as the operational effects described in the first embodiment regarding the formation method are obtained. For example, the insulating layer 102 and the organic semiconductor layer 103 can be formed in a shorter time without damaging the substrate 10B. Further, when the insulating layer 102 and the organic semiconductor layer 103 are formed by the above-described coating method, the insulating layer 102 and the organic semiconductor layer 103 are not mixed even if the organic semiconductor layer 103 is formed by a coating method after forming the insulating layer 102. In addition, the hole injection layer 106 is formed by the same formation method as the hole injection layer 22 in the first embodiment, and thus, the same operational effects as the case described with the method for forming the hole injection layer 22 in the first embodiment, more particularly, the operational effects which are the same as the operational effects obtained by heating and activating the inactive hole injection layer 22b are obtained.

In the organic thin film transistor 1C, a layer made of another compound may be further interposed between the source electrode 104 and the drain electrode 105, and the organic semiconductor layer 103. Examples of such a layer include a layer made of a low molecular weight compound having an electron transporting property, a low molecular weight compound having a hole transport property, an alkali metal, an alkaline earth metal, a rare-earth metal, a complex of these metals and an organic compound, halogen such as iodine, bromine, chlorine, and iodine chloride, a sulfur oxide compound such as sulfuric acid, sulfuric anhydride, sulfur dioxide, and sulfate, a nitrogen oxide compound such as nitric acid, nitrogen dioxide, and nitrate, a halogenated compound such as perchloric acid and hypochlorous acid, an alkyl thiol compound, an aromatic thiol compound such as aromatic thiols and fluorinated alkyl aromatic thiols, and the like.

When the layer interposed between the source electrode 104 and the drain electrode 105, and the organic semiconductor layer 103 is an organic functional layer, it is possible to apply the method for forming the organic functional layer using the infrared heating together with the coating liquid containing the material having the crosslinking group (including the polymerizable group) described in the first embodiment, for formation of the organic functional layer.

Figure 13:
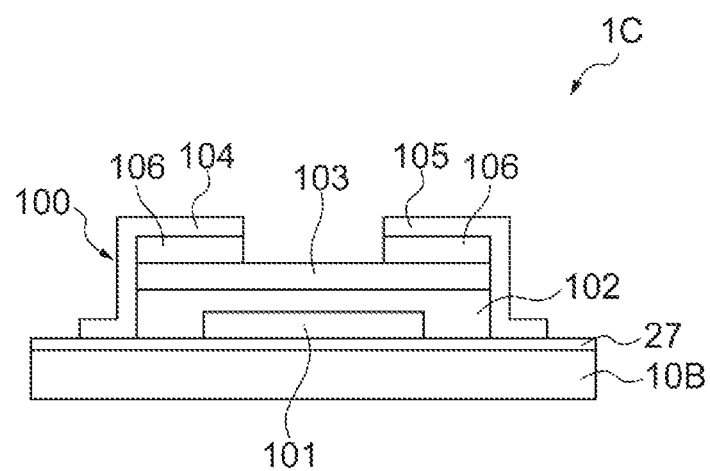
FIG. 13 is a view schematically illustrating an example of a configuration of an organic transistor which is an embodiment of the organic electronic element according to the present invention.

Although FIG. 13 illustrates the organic thin film transistor which is the field effect type and a bottom gate top contact type, the field-effect type organic thin film transistor may have another well-known configuration, for example, a bottom gate bottom contact type configuration. Further, the organic thin film transistor may be the electrostatic induction type organic thin film transistor described above. The above-described hole injection layer 106 is not limited to the case where the layer can be provided between both the source electrode 104 and the drain electrode 105, and the organic semiconductor layer 103, and may be provided between the source electrode 104 and the organic semiconductor layer 103 or between the drain electrode 105 and the organic semiconductor layer 103.

Although various embodiments of the present invention have been described as above, the present invention is not limited to the various illustrated embodiments. The scope of the present invention is defined by the claims, and equivalence of and any modification within the scope of the claims are intended to be included therein. For example, there is no particular limitation in the method for manufacturing the organic EL element 1A, the organic photoelectric conversion element 1B, and the organic thin film transistor 1C as long as the hole injection layer contained therein is formed by the formation method described in the first embodiment.

The organic electronic element preferably has two or more electrodes and has two organic functional layers including the hole injection layer arranged between the two or more electrodes. An organic functional layer different from the hole injection layer between the two organic functional layers is a layer defining the form of the organic electronic element (for example, the organic EL element or the like), and, for example, the light-emitting layer, the active layer, and the organic semiconductor layer in each of the organic EL element, the organic photoelectric conversion element, and the organic thin film transistor. The organic functional layer arranged between the two or more electrodes includes not only the case of being physically positioned so as to be sandwiched between the pair of electrodes, for example, as illustrated in FIG. 1 but also the case of being arranged to form a path (current path) of movement of holes or electrons, for example. When the organic functional layer is physically positioned so as to be sandwiched between the pair of electrodes, the organic functional layer generally serves as the current path.

The organic electronic element described above may have a protective film that covers the element body in order to protect the element body. Accordingly, the organic electronic element is blocked from the atmosphere, and it is possible to suppress deterioration (for example, deterioration of characteristics) of the organic electronic element. Regarding the organic thin film transistor, when an additional electronic element is formed on the organic thin film transistor, it is also possible to use the protective film to reduce the influence on the organic thin film transistor in such a formation step. Examples of a method for forming the protective film include a method of covering the organic electronic element with a UV-curing resin, a thermosetting resin, or a film containing $SiON_X$ as a material, and the like.

REFERENCE SIGNS LIST

1A . . . Organic EL element (organic electronic element), 1B . . . Organic photoelectric conversion element (organic electronic element), 1C . . . Organic thin film transistor (organic electronic element), 10, 10A, 10B . . . Substrate (plastic substrate), 20, 90, 100 . . . Element body, 21, 91 . . . Anode layer, 22 . . . Hole injection layer, 23 . . . Hole transport layer, 24 . . . Light-emitting layer, 25 . . . Electron injection layer, 26, 92 . . . Cathode layer, 27 . . . Barrier layer, 30A . . . Unwinding roll, 30B . . . Winding roll.

The invention claimed is:

1. A method for manufacturing an organic electronic element having a hole injection layer, the method comprising:
  a hole injection layer coating film formation step of applying a hole injection layer coating liquid containing a hole injection material on a plastic substrate to form a hole injection layer coating film; and
  a heat treatment step of heating the hole injection layer coating film by irradiating the hole injection layer coating film with an infrared ray to form a hole injection layer,
  wherein the hole injection layer coating film has absorption in a first wavelength range of 1.2 µm to 5.0 µm, and
  the infrared ray is an infrared ray in which an 80% or more of total radiation energy of the infrared ray in a wavelength range of 1.2 µm to 10.0 µm is included in the first wavelength range.

2. The method for manufacturing an organic electronic element according to claim 1, wherein
  in an absorption spectrum of a plastic material constituting the plastic substrate, an integral value of the absorption spectrum in the first wavelength range is smaller than an integral value of the absorption spectrum in a second wavelength range of 5.0 µm to 10.0 µm.

3. The method for manufacturing an organic electronic element according to claim 1, wherein
  an integral value of the first wavelength range is larger than an integral value of a second wavelength range of 5.0 µm to 10.0 µm in a spectrum of a product of a radiation spectrum of the infrared ray and an absorption spectrum of the hole injection layer coating film.

4. The method for manufacturing an organic electronic element according to claim 1, wherein
  the hole injection layer coating film is heated by a heat source different from the infrared ray together with heating by the infrared ray in the heat treatment step.

5. The method for manufacturing an organic electronic element according to claim 1, wherein
  the plastic substrate is heated such that a temperature of the plastic substrate is equal to or lower than a glass transition temperature of a material constituting the plastic substrate in the heat treatment step.

6. The method for manufacturing an organic electronic element according to claim 1, wherein
  the plastic substrate has flexibility, and
  the heat treatment step is performed during a course of winding the plastic substrate, fed out from the plastic substrate wound around an unwinding roll, onto a winding roll.

7. The method for manufacturing an organic electronic element according to claim 1, wherein
  the organic electronic element is an organic electroluminescence element, an organic photoelectric conversion element, or an organic thin film transistor.

8. The method for manufacturing an organic electronic element according to claim 3, wherein
  when an integral value of the first wavelength range is A1 and an integral value of the second wavelength range is A2 in a spectrum of a product of a radiation spectrum of the infrared ray and an absorption spectrum of the hole injection layer coating film, A1/(A1+A2) is 0.8 or more.

9. A method for forming a hole injection layer comprising:
a hole injection layer coating film formation step of applying a hole injection layer coating liquid containing a hole injection material on a plastic substrate to form a hole injection layer coating film; and
a heat treatment step of heating the hole injection layer coating film by irradiating the hole injection layer coating film with an infrared ray to form the hole injection layer,
wherein the hole injection layer coating film has absorption in a first wavelength range of 1.2 µm to 5.0 µm, and
the infrared ray is an infrared ray in which an 80% or more of total radiation energy of the infrared ray in a wavelength range of 1.2 µm to 10.0 µm is included in the first wavelength range.

10. The method for forming a hole injection layer according to claim 9, wherein
in an absorption spectrum of a plastic material constituting the plastic substrate, an integral value of the absorption spectrum of the first wavelength range is smaller than an integral value of the absorption spectrum of a second wavelength range of 5.0 µm to 10.0 µm.

11. The method for forming a hole injection layer according to claim 9, wherein
an integral value of the first wavelength range is larger than an integral value of a second wavelength range of 5.0 µm to 10.0 µm in a spectrum of a product of a radiation spectrum of the infrared ray and an absorption spectrum of the hole injection layer coating film.

12. The method for forming a hole injection layer according to claim 9, wherein
the hole injection layer coating film is heated by a heat source different from the infrared ray together with heating by the infrared ray in the heat treatment step.

13. The method for forming a hole injection layer according to claim 9, wherein
the plastic substrate is heated such that a temperature of the plastic substrate is equal to or lower than a glass transition temperature of a material constituting the plastic substrate in the heat treatment step.

14. The method for forming a hole injection layer according to claim 9, wherein
the plastic substrate has flexibility, and
the heat treatment step is performed during a course of winding the plastic substrate, fed out from the plastic substrate wound around an unwinding roll, onto a winding roll.

15. The method for forming a hole injection layer according to claim 11, wherein
when an integral value of the first wavelength range is A1 and an integral value of the second wavelength range is A2 in a spectrum of a product of a radiation spectrum of the infrared ray and an absorption spectrum of the hole injection layer coating film, A1/(A1+A2) is 0.8 or more.

* * * * *